US012127437B2

(12) United States Patent
Kim et al.

(10) Patent No.: US 12,127,437 B2
(45) Date of Patent: Oct. 22, 2024

(54) DISPLAY DEVICE

(71) Applicant: Samsung Display Co., Ltd., Yongin-si (KR)

(72) Inventors: In Woo Kim, Asan-si (KR); Jae Hee Kim, Sejong-si (KR); Myeong Hun Song, Pyeongtaek-si (KR); Ho Kyun Ahn, Seoul (KR); Jeong Kook Wang, Hwaseong-si (KR); Seung Jin Chu, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 650 days.

(21) Appl. No.: 17/446,919

(22) Filed: Sep. 3, 2021

(65) Prior Publication Data

US 2022/0199713 A1   Jun. 23, 2022

(30) Foreign Application Priority Data

Dec. 17, 2020  (KR) .......................... 10-2020-0176997

(51) Int. Cl.
*H10K 59/122* (2023.01)
*H10K 59/124* (2023.01)

(52) U.S. Cl.
CPC ......... *H10K 59/122* (2023.02); *H10K 59/124* (2023.02)

(58) Field of Classification Search
CPC ... H01L 25/167; H01L 33/20; H01L 25/0753; H01L 33/62; H01L 27/1214; H01L 33/06; H10K 59/122; H10K 59/124
See application file for complete search history.

(56) References Cited

U.S. PATENT DOCUMENTS 9,356,079 B2 *  5/2016  Choi .................. H10K 59/8792
9,978,725 B2     5/2018  Do
(Continued)

FOREIGN PATENT DOCUMENTS

CN     102193301 A    9/2011
JP    2006-173604 A   6/2006
(Continued)

OTHER PUBLICATIONS

Korean International Search Report issued in corresponding International Application No. PCT/KR2021/019088, dated Mar. 23, 2022, 3 pages.

*Primary Examiner* — Kevin Quarterman
(74) *Attorney, Agent, or Firm* — Lewis Roca Rothgerber Christie LLP

(57) ABSTRACT

A display device includes: a substrate; a first bank including a first sub-bank and a second sub-bank spaced apart from each other on the substrate; a first electrode on the first sub-bank; a second electrode on the second sub-bank and spaced apart from the first electrode; and a light-emitting element between the first sub-bank and the second sub-bank. Each of the first and second sub-banks has a first area having a concave curved shape in a cross section and being adjacent to the light-emitting element. The first electrode has a first section extending beyond the first sub-bank toward the light-emitting element, the second electrode has a first section extending beyond the second sub-bank toward the light-emitting element, and a width of the first section of the first electrode is different from a width of the first section of the second electrode.

20 Claims, 21 Drawing Sheets

(56) References Cited

U.S. PATENT DOCUMENTS

| | | | |
|---|---|---|---|
| 2014/0367705 A1 | 12/2014 | Bibl et al. | |
| 2015/0325631 A1* | 11/2015 | Yamazaki | H01L 27/1225 |
| | | | 257/40 |
| 2016/0172339 A1 | 6/2016 | Do | |
| 2017/0005148 A1 | 1/2017 | Kwon | |
| 2017/0062528 A1* | 3/2017 | Aoyama | H10K 59/122 |
| 2020/0365776 A1* | 11/2020 | Sim | H01L 33/54 |
| 2021/0151712 A1* | 5/2021 | Lee | H10K 59/121 |
| 2021/0202803 A1* | 7/2021 | Park | H01L 33/44 |
| 2021/0217738 A1* | 7/2021 | Bae | H01L 33/62 |
| 2021/0280746 A1* | 9/2021 | Kim | H01L 33/382 |
| 2022/0052032 A1 | 2/2022 | Li et al. | |
| 2023/0343899 A1* | 10/2023 | Lee | H01L 33/382 |

FOREIGN PATENT DOCUMENTS

| | | |
|---|---|---|
| KR | 10-1429095 B1 | 8/2014 |
| KR | 10-1436123 B1 | 11/2014 |
| KR | 2017-0002842 A | 1/2017 |
| KR | 10 2020-0033379 A | 3/2020 |
| KR | 2020-0070493 A | 6/2020 |
| KR | 2020-0118937 A | 10/2020 |

\* cited by examiner

DISPLAY DEVICE

CROSS-REFERENCE TO RELATED APPLICATION

This application claims priority to and the benefit of Korean Patent Application No. 10-2020-0176997, filed on Dec. 17, 2020, in the Korean Intellectual Property Office, the disclosure of which is incorporated herein by reference in its entirety.

BACKGROUND

1. Field

Aspects of embodiments of the present disclosure relate to a display device.

2. Description of the Related Art

Display devices become more and more important as multimedia technology evolves. Accordingly, a variety of types of display devices, such as organic light-emitting diode (OLED) display devices and liquid-crystal display (LCD) devices, are currently used.

Display devices generally include a display panel, such as an organic light-emitting display panel and a liquid-crystal display panel, for displaying images. Among them, light-emitting display panel may include light-emitting elements. For example, light-emitting diodes (LEDs) may include an organic light-emitting diode using an organic material as a luminescent material and an inorganic light-emitting diode using an inorganic material as a luminescent material.

SUMMARY

Embodiments of the present disclosure provide a display device including a sub-bank having an outer surface that faces a light-emitting element and has a concave curved shape.

Aspects and features of the present disclosure provide a display device having improved light output efficiency.

It should be noted that aspects and features of the present disclosure are not limited to those mentioned above; and other aspects and features of the present disclosure will be apparent to those skilled in the art from the following description.

According to an embodiment of the present disclosure, a display device includes: a substrate; a first bank including a first sub-bank and a second sub-bank spaced apart from each other on the substrate; a first electrode on the first sub-bank; a second electrode on the second sub-bank and spaced apart from the first electrode; and a light-emitting element between the first sub-bank and the second sub-bank. Each of the first and second sub-banks has a first area having a concave curved shape in a cross section and being adjacent to the light-emitting element. The first electrode has a first section extending beyond (or extending from) the first sub-bank toward the light-emitting element, the second electrode has a first section extending beyond the second sub-bank toward the light-emitting element, and a width of the first section of the first electrode is different from a width of the first section of the second electrode.

In an embodiment, an inclination angle of an outer surface of the first area of the first sub-bank and an inclination angle of an outer surface of the first area of the second sub-bank may increase along a thickness direction of the substrate.

In an embodiment, each of the first and second sub-banks may also have a second area having an inclination angle of an outer surface decreasing along the thickness direction of the substrate.

In an embodiment, the first electrode may be on the first sub-bank and formed along a surface shape of the first sub-bank, and the second electrode may be on the second sub-bank and formed along a surface shape of the second sub-bank.

In an embodiment, the first electrode may also have a second section on the first area of the first sub-bank, the second electrode may also have a second section on the first area of the second sub-bank, and each of the second section of the first electrode and the second section of the second electrode may have a concave curved shape in a cross section.

In an embodiment, each of the first electrode and the second electrode may include silver (Ag), aluminum (Al), or an alloy thereof.

In an embodiment, the second section of the first electrode and the second section of the second electrode may face both ends of the light-emitting element, respectively.

In an embodiment, the display device may further include a via layer on the substrate and having a flat surface, and the first sub-bank and the second sub-bank may be directly on the via layer.

In an embodiment, the first electrode may also have a second section on the first area of the first sub-bank and may have a concave curved shape in a cross section. The first section of the first electrode may be disposed on the via layer and may have a flat cross-sectional shape.

In an embodiment, the first section of the first electrode may extend from the second section of the first electrode.

In an embodiment, a height from a surface of the substrate to the first area of the first sub-bank may be greater than a height from the surface of the substrate to an upper surface of the light-emitting element.

In an embodiment, a first end of the light-emitting element may overlap the first section of the first electrode in a thickness direction of the substrate, a second end of the light-emitting element may overlap the first section of the second electrode in the thickness direction of the substrate, and a width of the first section of the first electrode may be greater than a width of the first section of the second electrode.

In an embodiment, a width at where the first end of the light-emitting element overlaps the first section of the first electrode in the thickness direction of the substrate may be greater than a width at where the second end of the light-emitting element overlaps the first section of the second electrode in the thickness direction of the substrate.

In an embodiment, the light-emitting element may include a first semiconductor layer, a second semiconductor layer spaced apart from the first semiconductor layer, and an active layer between the first semiconductor layer and the second semiconductor layer. The second semiconductor layer may be nearer to the first end of the light-emitting element than the second end of the light-emitting element, and the first semiconductor layer may be nearer to the second end of the light-emitting element than the first end of the light-emitting element.

In an embodiment, the active layer may be nearer to the first end of the light-emitting element from a center of the light-emitting element, and the first section of the first electrode may extend entirely under the second semiconductor layer and the active layer of the light-emitting element.

According to another embodiment of the present disclosure, a display device includes: a substrate; a via layer on the substrate; a first sub-bank on the via layer; a second sub-bank on the via layer and spaced apart from the first sub-bank; a first electrode on the first sub-bank; a second electrode on the second sub-bank; and a light-emitting element between the first sub-bank and the second sub-bank. Each of the first and second sub-banks has a first area facing both ends of the light-emitting element and having a concave curved shape in a cross section. The first electrode has a first section on the first area of the first sub-bank and a second section extending from the first section of the first electrode toward the light-emitting element, and the second electrode has a first section on the first area of the second sub-bank and a second section extending from the first section of the second electrode toward the light-emitting element. The second section of the first electrode and the second section of the second electrode are spaced apart from each other on the via layer, and a width of the second section of the first electrode is different from a width of the second section of the second electrode.

In an embodiment, the first electrode may be on the first sub-bank and on the via layer and may be formed along surface shapes of the first sub-bank and the via layer thereunder. The second electrode may be on the second sub-bank and the via layer and may be formed along surface shapes of the second sub-bank and the via layer thereunder.

In an embodiment, each of the first section of the first electrode and the first section of the second electrode may have a concave curved shape in a cross section, and each of the second section of the first electrode and the second section of the second electrode may be flat.

In an embodiment, the light-emitting element may include an active layer, the active layer may be nearer to a first end of the light-emitting element from a center of the light-emitting element, and the first end of the light-emitting element may face the first area of the first sub-bank.

In an embodiment, the second section of the first electrode may overlap the first end of the light-emitting element in a thickness direction of the substrate, the second section of the second electrode may overlap a second end of the light-emitting element in the thickness direction of the substrate, and a width of the second section of the first electrode may be greater than a width of the second section of the second electrode.

The details of one or more embodiments of the present disclosure are shown in the accompanying drawings and are descripted in the specification below.

The display device according to an embodiment may include a first bank that includes a plurality of sub-banks spaced apart from each other and having curved outer surfaces. A plurality of electrodes may be disposed on the sub-banks. The light-emitting diodes may be disposed between the sub-banks to be electrically connected to the electrodes. The plurality of sub-banks may have a first area having a concave outer surface on one side facing the light-emitting diode such that light emitted from the light-emitting diode is reflected by the surface of the electrode disposed on the first area of the sub-bank. Because the outer surface of the sub-bank that faces the light-emitting diode has a concave curved shape, the amount of light emitted from the light-emitting diode and directed toward the display side (or display surface) of the display device is increased and the light collection efficiency is improved. As a result, the output efficiency of the display device can be improved.

It should be noted that aspects and features of the present disclosure are not limited to those described above and other aspects and features of the present disclosure will be apparent to those skilled in the art from the following descriptions.

BRIEF DESCRIPTION OF THE DRAWINGS

The above and other aspects and features of the present disclosure will become more apparent by describing, in detail, embodiments thereof with reference to the attached drawings, in which.

DETAILED DESCRIPTION

Figure 1:
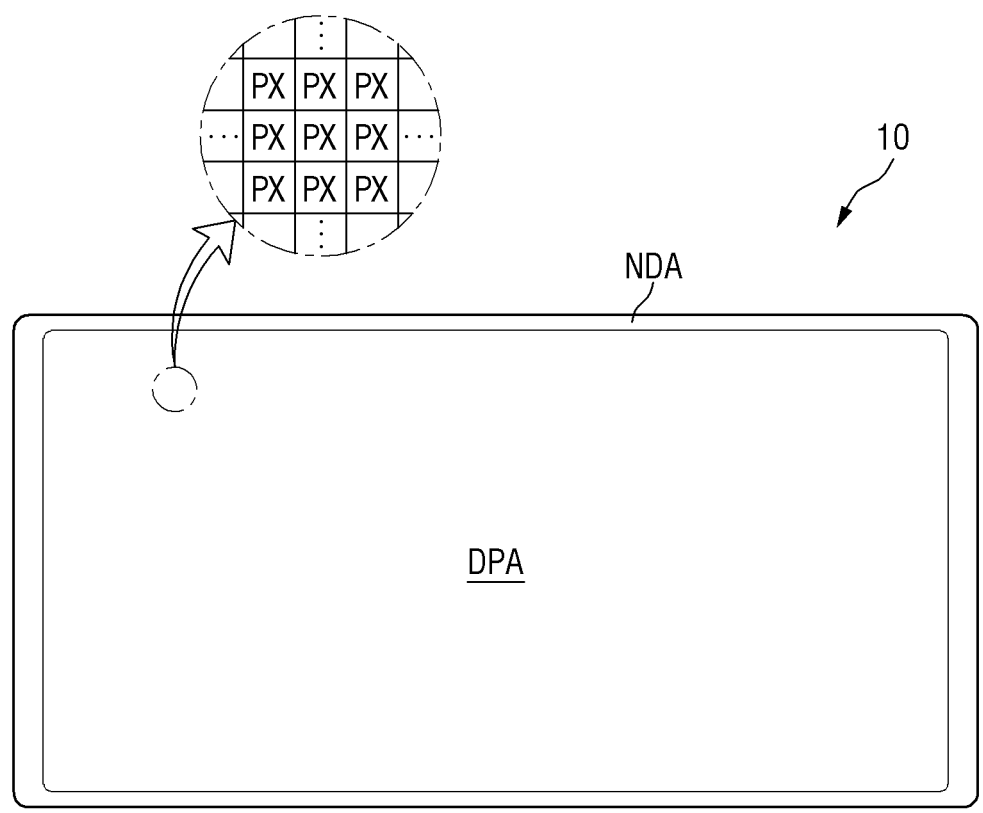
FIG. 1 is a plan view of a display device according to an embodiment of the present disclosure.

The present disclosure will now be described more fully hereinafter with reference to the accompanying drawings, in which embodiments of the present disclosure are shown. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present disclosure and is not intended to be limiting of the described example embodiments of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Hereinafter, embodiments of the present disclosure will be described with reference to the accompanying drawings.

FIG. 1 is a plan view of a display device according to an embodiment of the present disclosure.

Referring to FIG. 1, a display device 10 is configured to display a moving image or a still image. The display device 10 may refer to any electronic device that provides (or includes) a display screen. For example, the display device 10 may include a television set, a laptop computer, a monitor, an electronic billboard, an Internet of Things (IoT) device, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console and a digital camera, a camcorder, etc.

The display device 10 includes a display panel for providing a display screen. Examples of the display panel may include an inorganic light-emitting diode display panel, an organic light-emitting diode display panel, a quantum-dot light-emitting display panel, a plasma display panel, a field emission display panel, etc. In the following description, the display device 10 is described as an inorganic light-emitting diode display panel, but the present disclosure is not limited thereto. Other suitable display panels may be employed as long as the technical idea of the present disclosure can be equally applied thereto.

A first direction DR1, a second direction DR2, and a third direction DR3 are defined in the drawings. The display device 10 according to embodiments of the present disclosure will be described with reference to the drawings. The first direction DR1 may be perpendicular to the second direction DR2 in a plane The third direction DR3 may be perpendicular to the plane in which the first direction DR1 and the second direction DR2 are located. The third direction DR3 may be perpendicular to each of the first direction DR1 and the second direction DR2. In the following description of the display device 10 according to embodiments of the present disclosure, the third direction DR3 refers to the thickness direction (e.g., the display side or display direction) of the display device 10.

The display device 10 may have a rectangular shape having longer sides in the first direction DR1 and shorter sides in the second direction DR2 when viewed from the top. Although the corners at where the longer sides and the shorter sides of the display device 10 meet may form a right angle, this is merely illustrative. The display device 10 may have rounded corners. The shape of the display device 10 is not limited to that shown and may be modified in a variety of ways. For example, the display device 10 may have other shapes, such as a square, a rectangle with rounded corners (vertices), other polygons, and a circle.

A display surface may be located on one side of the display device 10 in the third direction DR3 (e.g., the thickness direction). In the following description, the upper side of the display device 10 refers to the side in the third direction DR3 where images are displayed, and the upper surface of the display device 10 refers to the surface facing in the third direction DR3, unless specifically stated otherwise. In addition, the lower side refers to the opposite side in the third direction DR3, and likewise the lower surface refers to the surface facing the opposite direction to the third direction DR3. As used herein, the terms "left," "right," "upper," and "lower" sides refer to relative positions when the display device 10 is viewed from the top. For example, the right side refers to one side in the first direction DR1, the left side refers to the opposite side in the first direction DR1, the upper side refers to one side in the second direction DR2, and the lower side refers to the opposite side in the second direction DR2.

The display device 10 may have a display area DPA and a non-display area NDA. Images can be displayed in the display area DPA. Images are not displayed in the non-display area NDA.

The shape of the display area DPA may follow the shape of the display device 10. For example, the display area DPA may have a rectangular shape generally similar to the shape of the display device 10 when viewed from the top. The display area DPA may generally occupy the majority of the center of the display device 10.

The display area DPA may include a plurality of pixels PX. The plurality of pixels PX may be arranged in a matrix. The shape of each of the pixels PX may be rectangular or square when viewed from the top. In an embodiment, each of the pixels PX may include a plurality of light-emitting elements including (or made of) inorganic particles.

The non-display area NDA may be disposed around the display area DPA. The non-display area NDA may entirely or partially surround (e.g., may extend around a periphery of) the display area DPA. The non-display area NDA may form the bezel of the display device 10.

Figure 2:
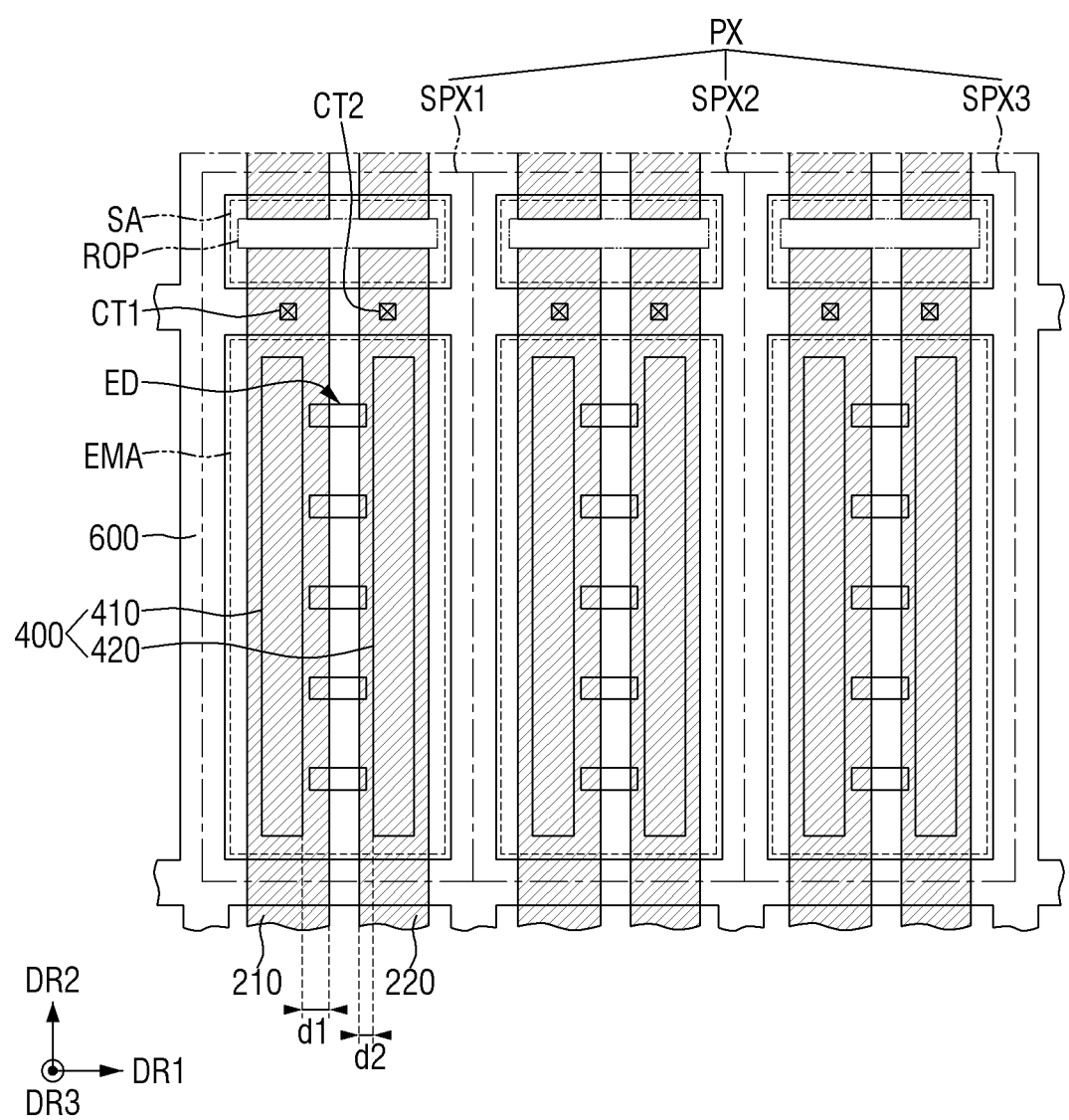
FIG. 2 is a schematic plan view showing a pixel of a display device according to an embodiment of the present disclosure.
Figure 3:
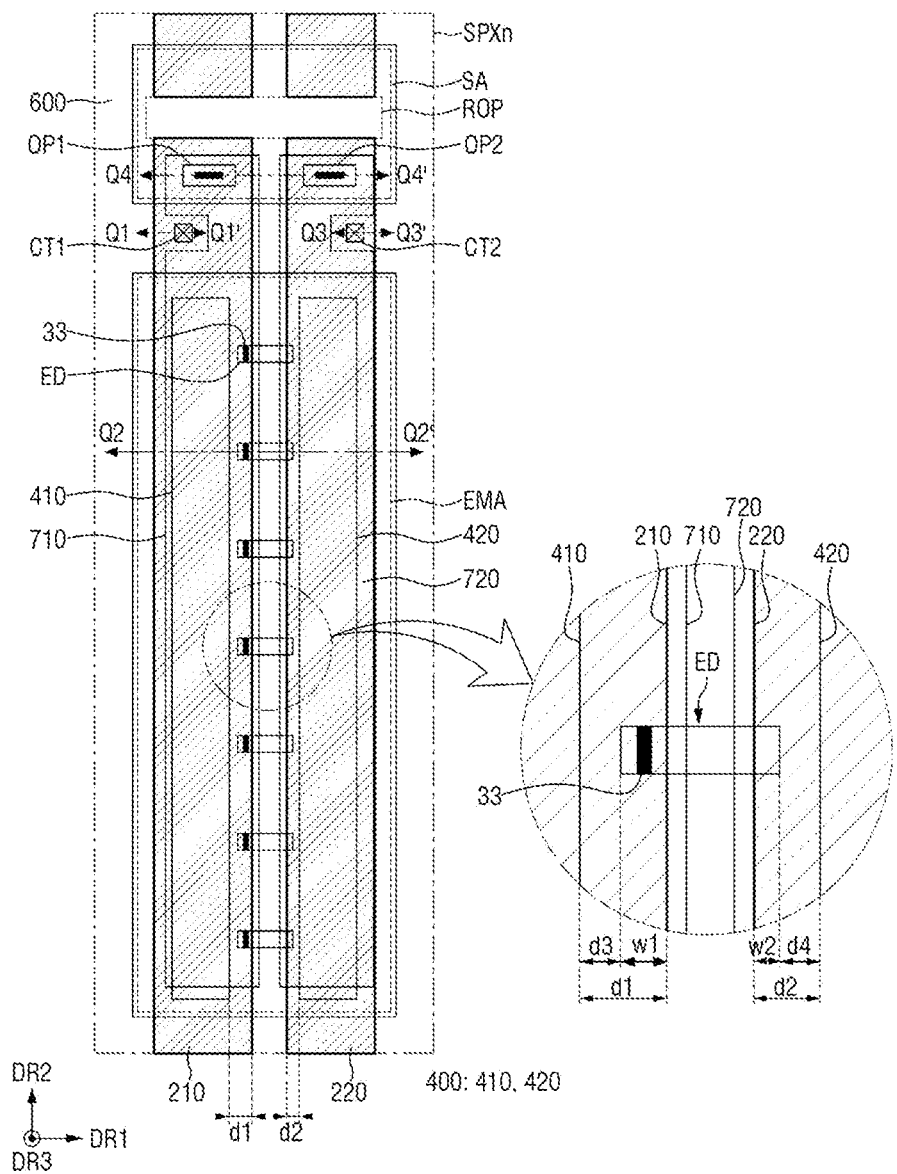
FIG. 3 is a plan view showing a sub-pixel of a display device according to an embodiment of the present disclosure.

FIG. 2 is a schematic plan view showing a pixel of a display device according to an embodiment of the present disclosure, and FIG. 3 is a plan view showing a sub-pixel of a display device according to an embodiment of the present disclosure.

Referring to FIG. 2, each of the pixels PX may include a plurality of sub-pixels SPX: SPX1, SPX2, and SPX3. For example, a pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. The first color may be blue, the second color may be green, and the third color may be red. It is, however, to be understood that the present disclosure is not limited thereto. The sub-pixels SPX1, SPX2 and SPX3 may emit light of the same color. Although the single pixel PX includes three sub-pixels SPX1, SPX2 and SPX3 in the example shown in FIG. 2, the present disclosure is not limited thereto. Each pixel PX may include more than three sub-pixels SPX.

Each of the sub-pixels SPX of the display device 10 may have an emission area EMA and a non-emission area. Light emitted from the light-emitting diodes ED may exit from the emission area EMA. Light emitted from the light-emitting diodes ED do not reach and, thus, no light exits from the non-emission area.

The emission area EMA may include an area where the light-emitting diodes ED are disposed and an area adjacent thereto. The emission area EMA may further include an area (e.g., the area adjacent to the area where the light-emitting diodes ED are disposed) in which light emitted from the light-emitting diodes ED is reflected or refracted by other elements to exit.

Each of the sub-pixels SPX may further include a subsidiary area SA disposed in the non-emission area. No light-emitting diodes ED may be disposed in the subsidiary area SA. The subsidiary area SA may be disposed at the upper side of the emission area EMA (e.g., at one side of the emission area EMA in the second direction DR2) within one pixel PX. The subsidiary area SA may be disposed between the emission areas EMA of neighboring pixels PX in the second direction DR2.

The subsidiary area SA may include a separation region ROP. In the separation region ROP of the subsidiary area SA, a first electrode 210 and a second electrode 220 included in a sub-pixel SPX may be separated from a first electrode 210 and a second electrode 220 included in another sub-pixel SPX adjacent to the sub-pixel SPX in the second direction DR2, respectively. Accordingly, portions of the first electrode 210 and the second electrode 220 disposed in each of the sub-pixels SPX may be disposed in the subsidiary area SA.

Referring to FIGS. 2 and 3, each sub-pixel SPX of the display device 10 according to an embodiment may include a plurality of electrodes 210 and 220, a first bank 400 including a plurality of sub-banks, a plurality of contact electrodes 710 and 720, a plurality of light-emitting diodes ED, and a second bank 600.

Hereinafter, referring to FIGS. 2 and 3, the arrangement structure of the plurality of electrodes 210 and 220, the first bank 400 including the plurality of sub-banks, the plurality of contact electrodes 710 and 720, the plurality of light-emitting diodes ED, and the second bank 600 included in a single sub-pixel SPX of the display device 10 according to an embodiment of the present disclosure when viewed from the top will be described.

The second bank 600 may be disposed in a lattice pattern on the entire surface in the display area DPA and may have portions extended in the first direction DR1 and the second direction DR2 when viewed from the top. The second bank 600 may be disposed along the border of each of the sub-pixels SPX to distinguish adjacent sub-pixels SPX from one another. The second bank 600 may be disposed to surround (e.g., to extend around a periphery of) the emission area EMA and the subsidiary area SA within each of the sub-pixels SPX to distinguish between them. For example, the emission area EMA and the subsidiary area SA in each of the sub-pixels SPX may be defined by the second bank 600.

The first bank 400 may be disposed in the emission area EMA. The first bank 400 may have a shape extended in the second direction DR2 in the emission area EMA. The first bank 400 may be extended in the second direction DR2 and may be spaced apart from the second bank 600 surrounding the emission area EMA. For example, the length of the first bank 400 in the second direction DR2 may be smaller than the length of the emission area EMA surrounded by the second bank 600 in the second direction DR2.

The first bank 400 may include a plurality of sub-banks 410 and 420 disposed to face each other in the emission area EMA. Because the plurality of sub-banks 410 and 420 are spaced apart from each other, the plurality of sub-banks 410 and 420 may provide a space in which the light-emitting diodes ED are disposed therebetween (e.g., the light-emitting diodes ED may be disposed in an area between the plurality of sub-banks 410 and 420). In addition, as will be described in more detail later, each of the plurality of sub-banks 410 and 420 has an outer surface that faces the light-emitting diode ED and has a concave curved shape such that it also acts as a reflective partition wall that changes the direction in which the light emitted from the light-emitting diode ED travels to be toward the display side.

The first bank 400 may include a first sub-bank 410 and a second sub-bank 420. The first sub-bank 410 and the second sub-bank 420 may be spaced apart from each other and face each other in the first direction DR1. For example, the first sub-bank 410 may be disposed on the left side of the emission area EMA when viewed from the top, and the second sub-bank 420 may be disposed on the right side of the emission area EMA when viewed from the top.

Although the first bank 400 included in one sub-pixel SPX includes two sub-banks (e.g., the first and second sub-banks 410 and 420) in the illustrated embodiment, the number of the plurality of sub-banks included in one sub-pixel SPX is not limited thereto. For example, the first bank 400 included in one sub-pixel SPX may include more than two sub-banks depending on the number of the electrodes 210 and 220.

The electrodes 210 and 220 may include a first electrode 210 and a second electrode 220. The first electrode 210 and the second electrode 220 may be spaced apart from and face each other in the first direction DR1.

The first electrode 210 may be disposed on the first sub-bank 410. The first electrode 210 may be disposed on the left side of each of the sub-pixels SPX when viewed from the top. The first electrode 210 may have a shape extended in the second direction DR2 when viewed from the top. The first electrode 210 may be disposed such that it passes through the emission area EMA. The first electrode 210 may be separated from the first electrode 210 of another sub-pixel SPX adjacent to it in the second direction DR2 at the separation region ROP of the subsidiary area SA.

The second electrode 220 may be disposed on the second sub-bank 420. The second electrode 220 may be spaced apart from the first electrode 210 in the first direction DR1. The second electrode 220 may be spaced apart from and face the first electrode 210 in the first direction DR1. The second electrode 220 may be disposed on the right side of each of the sub-pixels PX when viewed from the top. The second electrode 220 may have a shape extended in the second direction DR2 when viewed from the top. The second electrode 220 may be disposed to pass through the emission area EMA. The second electrode 220 may be separated from the second electrode 220 of another sub-pixel SPX adjacent to it in the second direction DR2 at the separation region ROP of the subsidiary area SA.

In some embodiments, the first electrode 210 and the second electrode 220 may be formed to have larger widths than the first sub-bank 410 and the second sub-bank 420, respectively. For example, the width of the first electrode 210 in the first direction DR1 may be larger than the width of the first sub-bank 410 in the first direction DR1, and the width of the second electrode 220 in the first direction DR1 may be larger than the width of the second sub-bank 420 in the first direction DR1. Accordingly, the distance between the first electrode 210 and the second electrode 220 in the first direction DR1, when viewed from the top, may be smaller than the distance between the first sub-bank 410 and the second sub-bank 420 in the first direction DR1.

The first electrode 210 and the second electrode 220 may be disposed to cover outer surfaces of the first and second sub-banks 410 and 420, respectively.

The first electrode 210 may cover the first sub-bank 410 to extend outwardly therefrom and may be disposed such that one side surface thereof that faces the second electrode 220 (e.g., the right side of the first electrode 210 when viewed from the top) is located between the first sub-bank 410 and the second sub-bank 420. Similarly, the second electrode 220 may cover the outer surface of the second sub-bank 420 to extend outwardly therefrom and may be disposed such that one side surface thereof that faces the first electrode 210 (e.g., the left side of the second electrode 220 when viewed from the top) is located between the first sub-bank 410 and the second sub-bank 420.

The width d1 of the portion of the first electrode 210 extended from the first sub-bank 410 into the area between the first sub-bank 410 and the second sub-bank 420 may be equal to a first horizontal distance d1 between the right side of the first electrode 210 and the right side of the first sub-bank 410. The right side of the first electrode 210 may be one side of the first electrode 210 that faces the second electrode 220. The right side of the first sub-bank 410 may be one side of the first sub-bank 410 that faces the second sub-bank 420 or one side of the first sub-bank 410 that faces a first end of the light-emitting diode ED, to be described later.

Similarly, the width d2 of the portion of the second electrode 220 extended from the second sub-bank 420 into the area between the first sub-bank 410 and the second sub-bank 420 may be equal to a second horizontal distance d2 between the left side of the second electrode 220 and the left side of the second sub-bank 420. The left side of the second electrode 220 may be one side of the second electrode 220 that faces the first electrode 210. The left side of the second sub-bank 420 may be one side of the second sub-bank 420 that faces the first sub-bank 410 or one side of the second sub-bank 420 that faces a second end of the light-emitting diode ED, to be described later, which is the opposite end to the first end.

The first horizontal distance d1 between the right side of the first electrode 210 and the right side of the first sub-bank 410 may be different from the second horizontal distance d2 between the left side of the second electrode 220 and the left side of the second sub-bank 420. For example, the width d1 of the portion of the first electrode 210 extended from the first sub-bank 410 into the area between the first sub-bank 410 and the second sub-bank 420 may be different from the width d2 of the portion of the second electrode 220 extended from the second sub-bank 420 into the area between the first sub-bank 410 and the second sub-bank 420. For example, the first horizontal distance d1 between the right side of the first electrode 210 and the right side of the first sub-bank 410 may be greater than the second horizontal distance d2 between the left side of the second electrode 220 and the left side of the second sub-bank 420. When the width d1 of the portion of the first electrode 210 extended from the first sub-bank 410 into the area between the first sub-bank 410 and the second sub-bank 420 is different from the width d2 of the portion of the second electrode 220 extended from the second sub-bank 420 into the area between the first sub-bank 410 and the second sub-bank 420, the width of the portion of the electrode 210 that overlaps the light-emitting diode ED may be different from the width of the portion of the second electrode 220 that overlaps the light-emitting diode ED, which will be described in more detail later.

Figure 7:
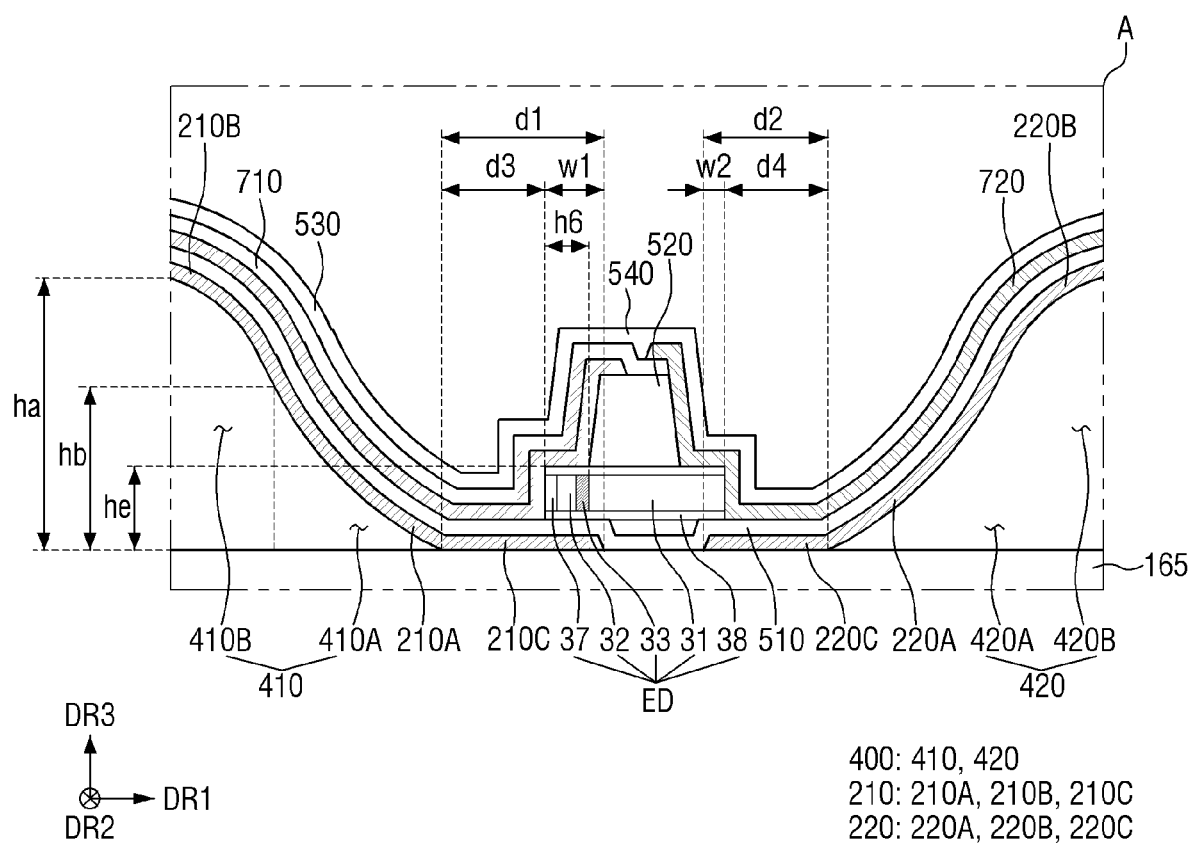
FIG. 7 is an enlarged, cross-sectional view showing the area A of FIG. 4.

In FIGS. 2 and 3, which illustrate the structure of the display device 10 when viewed from the top, the first horizontal distance d1 when viewed from the top is defined as "horizontal distance d1 between the right side of the first electrode 210 and the right side of the first sub-bank 410" or as "the width d1 of the portion of the first electrode 210 extended from the first sub-bank 410 into the area between the first sub-bank 410 and the second sub-bank 420". In FIG. 7, which illustrates the cross-sectional structure of the display device 10, and which will be described later, the same reference numeral "d1" may be defined as "the width d1 of the portion of the first electrode 210 that protrudes from the first sub-bank 410 into the area between the first sub-bank 410 and the second sub-bank 420" in a cross section. Likewise, the second horizontal distance d2 when viewed from the top is defined as "horizontal distance d2 between the left side of the second electrode 220 and the left side of the second sub-bank 420" or as "the width d2 of the portion of the second electrode 220 extended from the second sub-bank 420 into the area between the first sub-bank 410 and the second sub-bank 420". In FIG. 7, which illustrates the cross-sectional structure of the display device 10, and which will be described later, the same reference numeral "d2" may be defined as "the width d2 of the portion of the second electrode 220 that protrudes from the second sub-bank 420 into the area between the first sub-bank 410 and the second sub-bank 420" in a cross section.

The light-emitting diodes ED may be disposed between the first sub-bank 410 and the second sub-bank 420. The plurality of light-emitting diodes ED may have a shape extended in one direction and may be disposed such that both ends (e.g., opposite ends) thereof face the first sub-bank 410 and the second sub-bank 420, respectively, between the first sub-bank 410 and the second sub-bank when viewed from the top. For example, the plurality of light-emitting diodes ED may be disposed such that the first ends of the light-emitting diodes ED face one side of the first sub-bank 410 (e.g., the right side of the first sub-bank 410 when viewed from the top) and the second ends of the light-emitting diodes ED face one side of the second sub-bank 420 (e.g., the left side of the second sub-bank 420 when viewed from the top).

The light-emitting diodes ED may be disposed generally at the center between (e.g., substantially equidistant between) the first sub-bank 410 and the second sub-bank 420. For example, a third horizontal distance d3 between the first sub-bank 410 and the light-emitting diodes ED may be equal or substantially equal to a fourth horizontal distance d4 between the second sub-bank 420 and the light-emitting diodes ED. The third horizontal distance d3 between the first sub-bank 410 and the light-emitting diode element ED may be measured as the horizontal distance d3 between the right side of the first sub-bank 410 and the first end of the light-emitting diodes ED. The fourth horizontal distance d4 between the second sub-bank 420 and the light-emitting diode ED may be measured as the horizontal distance d4 between the left side of the second sub-bank 420 and the second end of the light-emitting diode ED. It is, however, to be understood that the present disclosure is not limited thereto. Some of the plurality of light-emitting diodes ED may be disposed closer to one of the sub-banks 410 and 420 between the first sub-bank 410 and the second sub-bank 420.

The plurality of light-emitting diodes ED may be disposed such that both ends of the light-emitting diodes ED are placed on the first electrode 210 and the second electrode 220, respectively, between the first sub-bank 410 and the second sub-bank 420. For example, the plurality of light-emitting diodes ED may be disposed such that the first ends of the light-emitting diodes ED are on the first electrode 210 while the second ends of the light-emitting diodes ED are on the second electrode 220.

The first electrode 210 may at least partially overlap the first ends of the light-emitting diodes ED in the third direction DR3. The width w1 at where the first electrode 210 overlaps the first ends of the light-emitting diodes ED in the third direction DR3 may be equal to a fifth horizontal distance w1 between the left side of the first electrode 210 and the first ends of the light-emitting diodes ED.

The second electrode 220 may at least partially overlap the second ends of the light-emitting diodes ED in the third direction DR3. The width w2 at where the second electrode 220 overlaps the second ends of the light-emitting diodes ED in the third direction DR3 may be equal to a sixth horizontal distance w2 between the right side of the second electrode 220 and the second ends of the light-emitting diodes ED.

The widths w1 and w2 at where the both ends of the light-emitting diodes ED overlap the first electrode 210 and the second electrode 220 in the third direction DR3, respectively, may be different from each other. For example, the light-emitting diodes ED are disposed at the center between the first sub-bank 410 and the second sub-bank 420, which are spaced apart from each other. When the width d1 of the portion of the first electrode 210 extended from the first sub-bank 410 into the area between the first sub-bank 410 and the second sub-bank 420 is different from the width d2 of the portion of the second electrode 220 extended from the second sub-bank 420 into the area between the first sub-bank 410 and the second sub-bank 420, the widths w1 and w2 at where the both ends of the light-emitting diodes ED overlap the first electrode 210 and the second electrode 220 in the third direction DR3, respectively, may be different from each other. For example, the width w1 at where the first ends of the light-emitting diodes ED overlap the first electrode 210 in the third direction DR3 may be different from the width w2 at where the second ends of the light-emitting diodes ED overlap the second electrode 220 in the third direction DR3. For example, the width w1 at where the first ends of the light-emitting diodes ED overlap the first electrode 210 in the third direction DR3 may be larger than the width w2 at where the second ends of the light-emitting diodes ED overlap the second electrode 220 in the third direction DR3.

When the width d1 of the portion of the first electrode 210 extended from the first sub-bank 410 into the area between the first sub-bank 410 and the second sub-bank 420 is different from the width d2 of the portion of the second electrode 220 extended from the second sub-bank 420 into the area between the first sub-bank 410 and the second sub-bank 420, the arrangement of the first electrode 210, the second electrode 220, and the light-emitting diodes ED may be controlled such that the widths w1 and w2 at where the both ends of the light-emitting diodes ED overlap the first electrode 210 and the second electrode 220 in the third direction DR3, respectively, are different from each other.

The contact electrodes 710 and 720 may include a first contact electrode 710 and a second contact electrode 720. The first contact electrode 710 and the second contact electrode 720 may be spaced apart from each other.

The first contact electrode 710 may be disposed on the first electrode 210. The first contact electrode 710 may have a shape extended in the second direction DR2. The first contact electrode 710 may contact the first electrode 210 and the first ends of the light-emitting diodes ED. The first contact electrode 710 may contact the first electrode 210 at an area exposed by a first opening OP1 in the subsidiary area SA and may contact the first ends of the light-emitting diode ED in the emission area EMA. The first contact electrode 710 may electrically connect the first end of the light-emitting diode ED with the first electrode 210.

The second contact electrode 720 may be disposed on the second electrode 220. The second contact electrode 720 may have a shape extended in the second direction DR2. The second contact electrode 720 may contact the second electrode 220 and the second ends of the light-emitting diodes ED. The second contact electrode 720 may contact the second electrode 220 at an area exposed by a second opening OP2 in the subsidiary area SA and may contact the second ends of the light-emitting diodes ED in the emission area EMA. The second contact electrode 720 may electrically connect the second ends of the light-emitting diodes ED with the second electrode 220.

Figure 4:
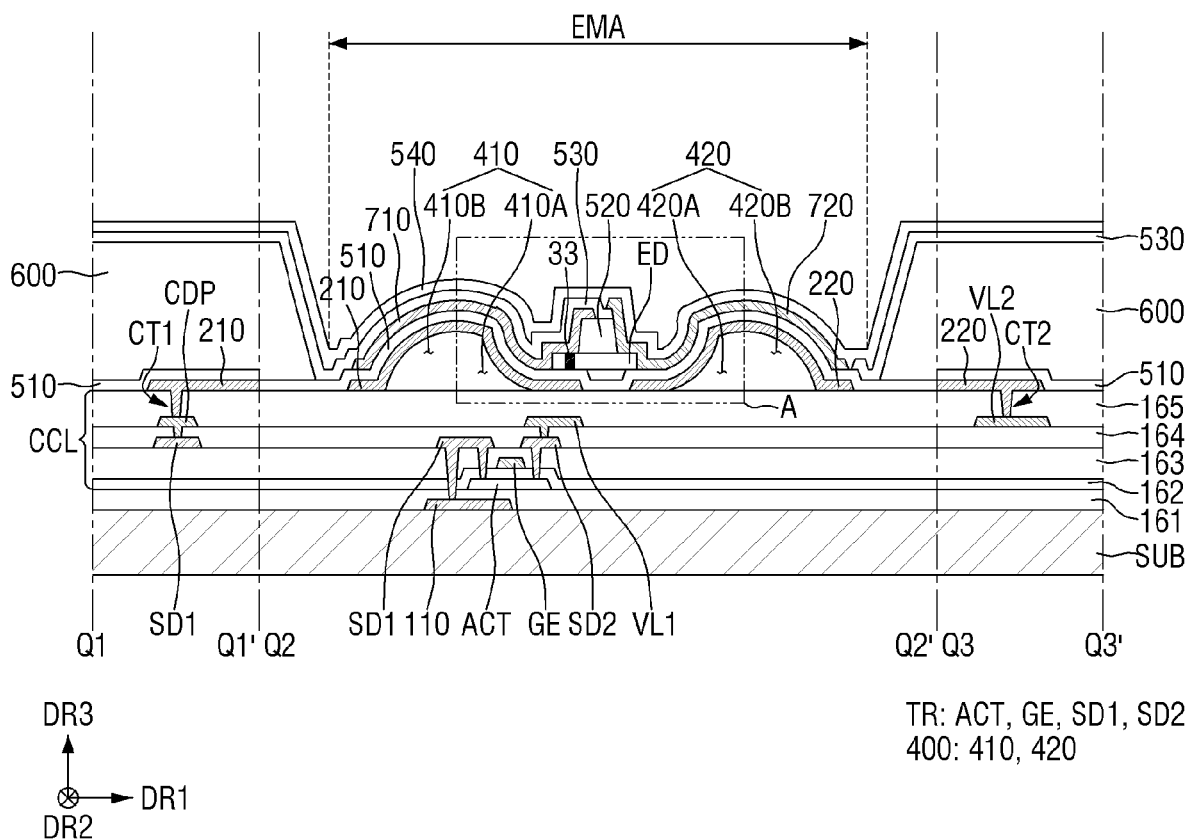
FIG. 4 is a cross-sectional view taken along the lines Q1-Q1', Q2-Q2', and Q3-Q3' of FIG. 3.
Figure 5:
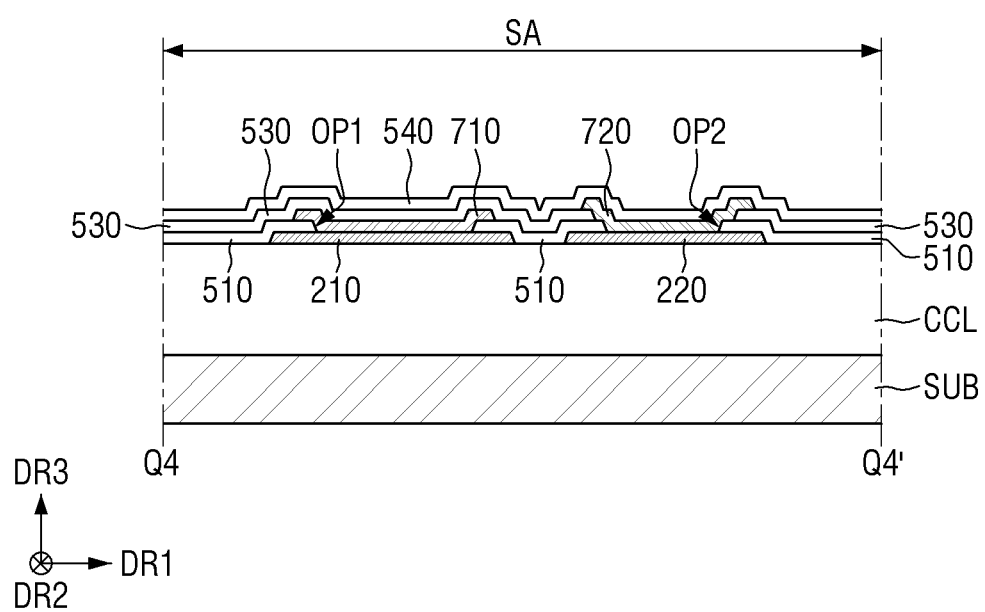
FIG. 5 is a cross-sectional view taken along the line Q4-Q4' of FIG. 3.

FIG. 4 is a cross-sectional view taken along the lines Q1-Q1', Q2-Q2', and Q3-Q3' of FIG. 3, and FIG. 5 is a cross-sectional view taken along the line Q4-Q4' of FIG. 3.

Referring to FIG. 4, the display device 10 may include a substrate SUB, a circuit element layer CCL disposed on the substrate SUB, the plurality of electrodes 210 and 220 disposed on the circuit element layer CCL, the first bank 400 including the plurality of sub-banks, and a display elements layer including the plurality of contact electrodes 710 and 720, the plurality of light-emitting diodes ED, the second bank 600, and a display element layer including a plurality of insulating layers.

The substrate SUB may be an insulating substrate. The substrate SUB may include (or may be made of) an insulating material, such as glass, quartz, and a polymer resin. The substrate SUB may be a rigid substrate or a flexible substrate that can be bent, folded, or rolled.

The circuit element layer CCL may be disposed on the substrate SUB. The circuit element layer CCL may include a plurality of conductive layers, at least one transistor TR, a plurality of insulating layers, and first and second voltage lines VL1 and VL2.

A bottom metal layer 110 may be disposed on the substrate SUB. The bottom metal layer 110 may be a light-blocking layer that protects an active layer ACT of the transistor TR. The bottom metal layer 110 may include a material that blocks (or substantially blocks) light. For example, the bottom metal layer 110 may include (or may be made of) an opaque metal material that blocks light transmission.

The bottom metal layer 110 may be disposed under and may cover at least a channel region of the active layer ACT of the transistor TR and, in some embodiments, may cover the entire active layer ACT of the transistor TR. It is, however, to be understood that the present disclosure is not limited thereto. The bottom metal layer 110 may be omitted.

A buffer layer 161 may be disposed over the bottom metal layer 110. The buffer layer 161 may be disposed to cover the entire surface of the substrate SUB on which the bottom metal layer 110 is disposed. The buffer layer 161 may protect a plurality of transistors from moisture permeating through the substrate SUB, which may be vulnerable to moisture permeation.

The semiconductor layer is disposed on the buffer layer 161. The semiconductor layer may include the active layer ACT of the transistor TR. The active layer ACT of the transistor TR may be disposed to overlap the bottom metal layer 110 as described above.

The semiconductor layer may include polycrystalline silicon, monocrystalline silicon, an oxide semiconductor, etc. According to an embodiment of the present disclosure, when the semiconductor layer includes polycrystalline silicon, the polycrystalline silicon may be formed by crystallizing amorphous silicon. When the semiconductor layer includes polycrystalline silicon, the active layer ACT of the transistor TR may include a plurality of doped regions doped with impurities and a channel region between them. In another embodiment, the semiconductor layer may include an oxide semiconductor. For example, the oxide semiconductor may be indium-tin oxide (ITO), indium-zinc oxide (IZO), indium-gallium oxide (IGO), indium-zinc-tin oxide (IZTO), indium-gallium-zinc oxide (IGZO), indium-gallium-tin oxide (IGTO), indium-gallium-zinc-tin oxide (IGZTO), etc.

A gate insulator 162 may be disposed on the semiconductor layer. The gate insulator 162 may act as a gate insulating layer of each transistor. The gate insulator 162 may include (or may be made up of) a plurality of layers in which inorganic layers including inorganic material (e.g., at least one of silicon oxide ($SiO_x$), silicon nitride ($SiN_x$) and silicon oxynitride ($SiO_xN_y$)) are stacked on one another alternately.

A first conductive layer may be disposed on the gate insulator 162. The first conductive layer may include a gate electrode GE of the transistor TR. The gate electrode GE of the transistor TR may be disposed so that it overlaps a channel region of the active layer ACT of the transistor TR in the thickness direction (e.g., the third direction DR3).

A first interlayer dielectric layer 163 may be disposed on the first conductive layer. The first interlayer dielectric layer 163 may cover the gate electrode GE of the transistor TR. The first interlayer dielectric layer 163 may act as an insulating layer between the first conductive layer and other layers disposed thereon and may protect the first conductive layer.

A second conductive layer may be disposed on the first interlayer dielectric layer 163. The second conductive layer may include a source electrode SD1 and a drain electrode SD2 of the transistor TR. The second conductive layer may further include a data line.

The source electrode SD1 and the drain electrode SD2 of the transistor TR may be electrically connected to both end regions of the active layer ACT of the transistor TR through contact openings (e.g., contact holes) penetrating the first interlayer dielectric layer 163 and the gate insulator 162, respectively. In addition, the source electrode SD1 may be electrically connected to the bottom metal layer 110 through another contact opening (e.g., another contact hole) penetrating through the first interlayer dielectric layer 163, the gate insulator 162, and the buffer layer 161.

A second interlayer dielectric layer 164 may be disposed on the second conductive layer. The second interlayer dielectric layer 164 may act as an insulating layer between the second conductive layer and other layers disposed thereon and may protect the second conductive layer.

A third conductive layer may be disposed on the second interlayer dielectric layer 164. The third conductive layer may include a first voltage line VL1, a second voltage line VL2, and a first conductive pattern CDP.

A high-level voltage (e.g., a first supply voltage) may be applied to the first voltage line VL1 to be supplied to the first transistor TR, and a low-level voltage (e.g., a second supply voltage), which is lower than the high-level voltage supplied to the first voltage line VL, may be applied to the second voltage line VL21.

The first voltage line VL1 may be electrically connected to the drain electrode SD2 of the transistor TR through a contact opening (e.g., contact hole) penetrating the second interlayer dielectric layer 164.

The second voltage line VL2 may be electrically connected to the second electrode 220 through a second electrode contact opening (e.g., a second electrode contact hole) CT2 penetrating through a via layer 165, to be described later. The second supply voltage applied to the second voltage line VL2 may be supplied to the second electrode 220. An alignment signal for aligning the light-emitting diodes ED during the process of fabricating the display device 10 may be applied to the second voltage line VL2.

The first conductive pattern CDP may be electrically connected to the transistor TR. The first conductive pattern CDP may be electrically connected to the source electrode SD1 of the transistor TR through a contact opening (e.g., a contact hole) penetrating the second interlayer dielectric layer 164. In addition, the first conductive pattern CDP may be electrically connected to the first electrode 210 through a first electrode contact opening (e.g., a first electrode contact hole) CT1 penetrating through the via layer 165. The transistor TR may transmit the first supply voltage applied from the first voltage line VL1 to the first electrode 210 through the first conductive pattern CDP.

The via layer 165 may be disposed on the third conductive layer. The via layer 165 may be disposed on the second interlayer dielectric layer 164 on which the third conductive layer is disposed. The via layer 165 may include an organic insulating material, for example, an organic material, such as polyimide (PI). The via layer 165 may provide a flat surface.

The buffer layer 161, the gate insulator 162, the first interlayer dielectric layer 163, and the second interlayer dielectric layer 164 may include (or may be made up of) a plurality of inorganic layers stacked on one another alternately. For example, the buffer layer 161, the gate insulator 162, the first interlayer dielectric layer 163, and the second interlayer dielectric layer 164 may include (or may be made up of) a double layer in which inorganic layers including at least one of silicon oxide ($SiO_x$), silicon nitride ($SiN_x$) and silicon oxynitride (SiON) are stacked on one another or may include (or may be made up of) a plurality of layers in which they are alternately stacked on one another. It is, however, to be understood that the present disclosure is not limited thereto. The buffer layer 161, the gate insulator 162, the first interlayer dielectric layer 163, and the second interlayer dielectric layer 164 may include (or may be made up of) a single inorganic layer including the above-described insulating material(s).

The first conductive layer, the second conductive layer, and the third conductive layer may include (or may be made up of) a single layer or a plurality of layers of one of molybdenum (Mo), aluminum (Al), chromium (Cr), gold (Au), titanium (Ti), nickel (Ni), neodymium (Nd), copper (Cu), or an alloy thereof. It is, however, to be understood that the present disclosure is not limited thereto.

The display element layer may be disposed on the via layer 165. Hereinafter, a structure of the display element layer disposed on the circuit element layer CCL will be described with reference to FIGS. 3 to 5.

The first bank 400 may be disposed on the via layer 165 in the emission area EMA. The first bank 400 may have a shape protruding in the thickness direction of the substrate SUB (e.g., the third direction DR3) with respect to one surface of the via layer 165.

Each of the first sub-bank 410 and the second sub-bank 420 may be disposed on one surface of the via layer 165. Each of the first sub-bank 410 and the second sub-bank 420 may have a shape protruding in the thickness direction of the substrate SUB with respect to the surface of the via layer 165.

According to an embodiment of the present disclosure, each of the first sub-bank 410 and the second sub-bank 420 may have a shape protruding from the via layer 165 and may have at least a partially a concave curved shape. As used herein, the expression "concave curved shape" may refer to a shape of an element in which an outer surface is recessed toward the inner side of the element and curved in cross section, or a shape of an element in which the slope of a tangent line on an outer surface of the element increases along the third direction DR3. In addition, the expression "convex curved shape" may refer to a shape of an element in which an outer surface protrudes toward the outer side of the element and curved in cross section, or a shape of an element in which the slope of a tangent line on an outer surface of the element decreases along the third direction DR3.

The first sub-bank 410 may have a first area 410A and a second area 410B that are distinguished by their arrangement relationships with the ends of the light-emitting diodes ED and their cross-sectional shapes.

The first area 410A of the first sub-bank 410 may face the first ends of the light-emitting diodes ED and may have a concave curved shape in a cross section. The first area 410A of the first sub-bank 410 may be located on one side (e.g., the right side in the drawing) facing the first ends of the light-emitting diodes ED. Accordingly, the first area 410A of the first sub-bank 410 may be located on one side facing the second sub-bank 420. The first area 410A of the first sub-bank 410 may have a shape that is recessed inwardly and curved in the cross section of the first sub-bank 410.

The second area 410B of the first sub-bank 410 may be located on the opposite side to the side facing the first ends of the light-emitting diodes ED and may have a convex curved shape. The second area 410B of the first sub-bank 410 may be located on the opposite side (e.g., the left side in the drawing) to the side facing the first ends of the light-emitting diodes ED. The second area 410B of the first sub-bank 410 may face the second bank 600. The second area 410B of the first sub-bank 410 may have a shape that protrudes outwardly and is curved in the cross section of the first sub-bank 410. Although the second area 410B of the first sub-bank 410 has a convex curved shape in the cross section in the drawings, the present disclosure is not limited thereto. For example, the second area 410B of the first sub-bank 410 may have an at least partially inclined side surface, or may have an at least partially concave curved shape in the cross section, similar to the first area 410A of the first sub-bank 410.

The second sub-bank 420 may have a first area 420A and a second area 420B that are distinguished by their arrangement relationships with the ends of the light-emitting diodes ED and their cross-sectional shapes.

The first area 420A of the second sub-bank 420 may face the second ends of the light-emitting diodes ED and may have a concave curved shape in a cross section. The first area 420A of the second sub-bank 420 may be located on one side (e.g., the left side in the drawing) facing the second ends of the light-emitting diodes ED. Accordingly, the first area 420A of the second sub-bank 420 may be located on one side facing the first sub-bank 410 and may face the first area 410A of the first sub-bank 410. The first area 420A of the second sub-bank 420 may have a shape that is recessed inwardly and curved in the cross section of the second sub-bank 420.

The second area 420B of the second sub-bank 420 may be located on the opposite side to the side facing the second ends of the light-emitting diodes ED and may have a convex curved shape. The second area 420B of the second sub-bank 420 may be located on the opposite side (e.g., the right side in the drawing) to the side facing the second ends of the light-emitting diodes ED. The second area 420B of the second sub-bank 420 may have a shape that protrudes outwardly and is curved in the cross section of the second sub-bank 420. Although the second area 420B of the second sub-bank 420 has a convex curved shape in the cross section in the drawings, the present disclosure is not limited thereto. For example, the second area 420B of the second sub-bank 420 may have an at least partially inclined side surface, or may have an at least partially concave curved shape in the cross section, similar to the first area 420A of the second sub-bank 420.

According to an embodiment of the present disclosure, the first bank 400 may include, but is not limited to, an organic insulating material, such as polyimide (PI).

The first electrode 210 and the second electrode 220 may be disposed on the first bank 400 and the via layer 165 exposed by the first bank 400. The first electrode 210 and the second electrode 220 may be electrically connected to the circuit element layer CCL disposed therebelow.

The first electrode 210 may be connected to the first conductive pattern CDP through the first electrode contact opening CT1 penetrating the via layer 165. For example, the first electrode 210 may contact the first conductive pattern CDP through the first electrode contact opening CT1 penetrating the via layer 165. The first electrode contact opening CT1 may overlap the second bank 600 in the third direction DR3, but the position of the first electrode contact opening CT1 is not limited thereto.

The second electrode 220 may be connected to the second voltage line VL2 through the second electrode contact opening CT2 penetrating the via layer 165. For example, the second electrode 220 may contact the second voltage line VL2 through the second electrode contact opening CT2 penetrating the via layer 165. The second electrode contact opening CT2 may be spaced apart from the first electrode contact opening CT1 and may overlap the second bank 600 in the third direction DR3, but the position of the second electrode contact opening CT2 is not limited thereto.

The first electrode 210 may be electrically connected to the transistor TR through the first conductive pattern CDP to receive the first supply voltage. The second electrode 220 may be electrically connected to the second voltage line VL2 to receive the second supply voltage. Because the first electrode 210 and the second electrode 220 are disposed separately in each of the sub-pixels PXn, the light-emitting diodes ED of different sub-pixels PXn may individually emit light.

The first electrode 210 may be disposed on the first sub-bank 410. The first electrode 210 may be disposed on the first sub-bank 410 to cover an outer surface of the first sub-bank 410. The first electrode 210 may be extended outwardly from the first sub-bank 410 and may be partially disposed on the surface of the via layer 165 exposed by (e.g., beyond the periphery of) the first sub-bank 410 and the second sub-bank 420 between the first sub-bank 410 and the second sub-bank 420.

The first electrode 210 may be disposed on the first sub-bank 410 and the via layer 165. The first electrode 210 may be disposed on the first sub-bank 410 and the via layer 165 and formed along the surface shape of the first sub-bank 410 and the via layer 165 disposed thereunder. Accordingly, the cross-sectional shape of the surface of the first electrode 210 disposed on the first sub-bank 410 may have a shape conforming to the shape of the outer surface (or surface) of the first sub-bank 410. In addition, a cross-sectional shape of the surface of the first electrode 210 disposed on the via layer 165 may have a shape conforming to the shape of the surface of the via layer 165. For example, the cross-sectional shape of the surface of the first electrode 210 disposed on the first sub-bank 410 may have a concave curved shape where it overlaps the first area 410A of the first sub-bank 410 in the third direction DR3 and a convex curved shape where it overlaps the second area 410B of the first sub-bank 410 in the third direction DR3. In addition, the cross-sectional shape of the surface of the first electrode 210 disposed on the via layer 165 may be flat where it overlaps the via layer 165 in the third direction DR3.

The second electrode 220 may be disposed on the second sub-bank 420. The second electrode 220 may be disposed on the second sub-bank 420 to cover an outer surface of the second sub-bank 420. The second electrode 220 may be extended outwardly from the second sub-bank 420 and may be partially disposed on the surface of the via layer 165 exposed by (e.g., beyond the periphery of) the first sub-bank 410 and the second sub-bank 420 between the first sub-bank 410 and the second sub-bank 420. The first electrode 210 and the second electrode 220 disposed between the first sub-bank 410 and the second sub-bank 420 may be spaced apart from each other on the via layer 165.

The second electrode 220 may be disposed on the second sub-bank 420 and the via layer 165. The second electrode 220 may be disposed on the second sub-bank 420 and the via layer 165 and formed along the surface shape of the second sub-bank 420 and the via layer 165. Accordingly, the cross-sectional shape of the surface of the second electrode 220 disposed on the second sub-bank 420 may have a shape conforming to the shape of the outer surface (or surface) of the second sub-bank 420. In addition, a cross-sectional shape of the surface of the second electrode 220 disposed on the via layer 165 may have a shape conforming to the shape of the surface of the via layer 165. For example, the cross-sectional shape of the surface of the second electrode 220 disposed on the second sub-bank 420 may have a concave curved shape where it overlaps the first area 420A of the second sub-bank 420 in the third direction DR3 and a convex curved shape where it overlaps the second area 420B of the second sub-bank 420 in the third direction DR3. In addition, the cross-sectional shape of the surface of the second electrode 220 disposed on the via layer 165 may be flat where it overlaps the via layer 165 in the third direction DR3.

Each of the first and second electrodes 210 and 220 may be electrically connected to the light-emitting diode ED. The first and second electrodes 210 and 220 may be connected to both ends of the light-emitting diode ED through contact electrodes 710 and 720, respectively, and may transmit electric signals applied from the circuit element layer CCL to the light-emitting diode ED.

Each of the first and second electrodes 210 and 220 may include a conductive material having high reflectance (e.g., a highly-reflective conductive material). For example, the first and second electrodes 210 and 220 may include a metal, such as silver (Ag), copper (Cu), and aluminum (Al) as the material having high reflectance, or may include an alloy including aluminum (Al), nickel (Ni), lanthanum (La), etc. The first and second electrodes 210 and 220 may reflect light that is emitted by the light-emitting diodes ED and travels (or propagates) to the outer surface of the first bank 400 at the surfaces of the first and second electrodes 210 and 220, respectively, which is then reflected toward the upper side of each of the sub-pixels SPX. The direction in which the light emitted by the light-emitting diodes ED travels will be described in more detail later.

It is, however, to be understood that the present disclosure is not limited thereto. Each of the first and second electrodes 210 and 220 may further include a transparent conductive material. For example, the first and second electrodes 210 and 220 may include a material, such as ITO, IZO, and ITZO. In some embodiments, the first and second electrodes 210 and 220 may have a structure in which one or more layers of a transparent conductive material and a metal layer having high reflectivity are stacked or may include (or may be made up of) a single layer including them. For example, each of the first and second electrodes 210 and 220 may have a stacked structure, such as ITO/Ag/ITO/, ITO/Ag/IZO, and ITO/Ag/ITZO/IZO.

A first insulating layer 510 may be disposed on the first and second electrode 210 and 220. The first insulating layer 510 may be disposed on the first and second electrode 210 and 220 to cover them. The first insulating layer 510 may protect the first electrode 210 and the second electrode 220 and insulate them from each other. In addition, the first insulating layer 510 may prevent or substantially prevent the light-emitting diode ED disposed thereon to be brought into contact with other elements and damaged.

The first insulating layer 510 may be disposed on the first electrode 210 and the second electrode 220 and may have a first opening OP1 that penetrates the first insulating layer 510 in the subsidiary area SA to expose at least a portion of the first electrode 210 and a second opening OP2 that penetrates the first insulating layer 510 in the subsidiary area SA to expose at least a portion of the second electrode 220.

The first opening OP1 exposes a portion of the upper surface of the first electrode 210 in the subsidiary area SA, and the second opening OP2 may expose a portion of the upper surface of the second electrode 220 in the subsidiary area SA. The first and second electrodes 210 and 220 may be electrically connected to the first and second contact electrodes 710 and 720, to be described later, through the first opening OP1 and the second opening OP2 in the subsidiary area SA, respectively.

The second bank 600 may be disposed on the first insulating layer 510. The second bank 600 may be disposed in a lattice pattern having portions extended in the first direction DR1 and the second direction DR2 when viewed from the top.

As described above, the second bank 600 may be disposed across the boundary of the sub-pixels SPX to distinguish between neighboring sub-pixels SPX and may distinguish the emission area EMA from the subsidiary area SA. In addition, the second bank 600 has a height greater than that of the first bank 400 to distinguish between the areas. Accordingly, during an inkjet printing process for depositing the light-emitting diodes ED in the process of fabricating the display device 10, the ink in which the plurality of light-emitting diodes ED is dispersed may be prevented or substantially prevented from being mixed into the adjacent sub-pixel SPX, and thus, the ink can be ejected (e.g., printed or deposited) into the emission area EMA.

The light-emitting diodes ED may be disposed on the first insulating layer 510. The light-emitting diodes ED may be spaced apart from one another along the second direction DR2 in which the first and second electrodes 210 and 220 are extended and may be aligned substantially parallel to one another.

The light-emitting diodes ED may be disposed between the first sub-bank 410 and the second sub-bank 420. A first end of the light-emitting diode ED may be spaced apart from and face the first area 410A of the first sub-bank 410, and a second end of the light-emitting diode ED may be spaced apart from and face the first area 420A of the second sub-bank 420. For example, the outer surfaces of the first sub-bank 410 and the second sub-bank 420 spaced apart from and facing the both ends of the light-emitting diode ED, respectively, may have concave curved shapes.

The light-emitting diode ED may be disposed on the first insulating layer 510 such that both ends thereof are placed on the first electrode 210 and the second electrode 220, respectively. The first electrode 210 and the second electrode 220 may at least partially overlap with the both ends of the light-emitting diode ED in the third direction DR3, respectively. The first electrode 210 may overlap the first end of the light-emitting diode ED in the third direction DR3, and the second electrode 220 may overlap the second end of the light-emitting diode ED in the third direction DR3. At least one of the first electrode 210 and the second electrode 220 may be disposed under the light-emitting diode ED to cover the active layer 33 of the light-emitting diode ED (see, e.g., FIG. 6).

The light-emitting diode ED may include semiconductor layers doped to have different conductivity types. The light-emitting diode ED may include multiple semiconductor layers and may be aligned so that its first end is directed in a particular orientation depending on the direction of an electric field generated between (or over) the first electrode 210 and the second electrode 220. In addition, the light-emitting diode ED may include the active layer 33 to emit light of a particular wavelength range.

A second insulating layer 520 may be partially disposed on the light-emitting diode ED. The second insulating layer 520 may be disposed to partially surround (e.g., to extend around) the outer surface of the light-emitting diode ED so that the both ends of the light-emitting diode ED are not covered (or are exposed). The portion of the second insulating layer 520 which is disposed on the light-emitting diode ED may be extended in the first direction DR1 on the first insulating layer 510 when viewed from the top, thereby forming a linear or island-like pattern in each of the sub-pixels SPX. The second insulating layer 520 may protect the light-emitting diode ED and may fix the light-emitting diode ED during the process of fabricating the display device 10.

The material forming the second insulating layer 520 may be disposed between the first electrode 210 and the second electrode 220, and the recessed empty space between the first insulating layer 510 and the light-emitting diode ED, may be filled with the material of the second insulating layer 520.

The first contact electrode 710 may be disposed on the second insulating layer 520. The first contact electrode 710 may be disposed on the first electrode 210. The first contact electrode 710 may contact the first end of the light-emitting diode ED exposed by the second insulating layer 520 and the first electrode 210. The first contact electrode 710 may contact the first electrode 210 exposed by the first opening OP1 formed with the sidewalls of the first insulating layer 510 in the subsidiary area SA and may contact the first end of the light-emitting diode ED exposed by the second insulating layer 520 in the emission area EMA. The first contact electrode 710 may electrically connect the first end of the light-emitting diode ED with the first electrode 210.

The third insulating layer 530 may be disposed on the first contact electrode 710. The third insulating layer 530 may be disposed to completely cover the first contact electrode 710 and may be disposed to expose the second end of the light-emitting diode ED so that the light-emitting diode ED contacts the second contact electrode 720 together with the second insulating layer 520. The third insulating layer 530 may electrically insulate the first contact electrode 710 from the second contact electrode 720. In addition, the third insulating layer 530 may form the second opening OP2 exposing the second electrode 220 together with the first insulating layer 510 in the subsidiary area SA.

The second contact electrode 720 may be disposed on the third insulating layer 530. The second contact electrode 720 may be disposed on the second electrode 220. The second contact electrode 720 may contact the second end of the light-emitting diode ED exposed by the second and third insulating layers 520 and 530 and the second electrode 220. The second contact electrode 720 may contact the second electrode 220 exposed by the second opening OP2 formed with the sidewalls of the first and third insulating layers 510 and 530 in the subsidiary area SA and may contact the second end of the light-emitting diode ED exposed by the second and third insulating layers 520 and 530 in the emission area EMA. The second contact electrode 720 may electrically connect the second ends of the light-emitting diodes ED with the second electrode 220.

The first and second contact electrodes 710 and 720 may include a conductive material. For example, the first and second contact electrodes 710 and 720 may include ITO, IZO, ITZO, aluminum (Al), etc. For example, the first and second contact electrodes 710 and 720 may include a transparent conductive material. Because the first and second contact electrodes 710 and 720 include a transparent conductive material, light emitted through the both ends of the light-emitting diode ED may transmit through the first and second contact electrodes 710 and 720 to proceed toward the first and second electrodes 210 and 220.

The fourth insulating layer 540 may be disposed on the second contact electrode 720. The fourth insulating layer 540 may be disposed entirely on the substrate SUB to protect the elements disposed thereon against the external environment.

Figure 6:
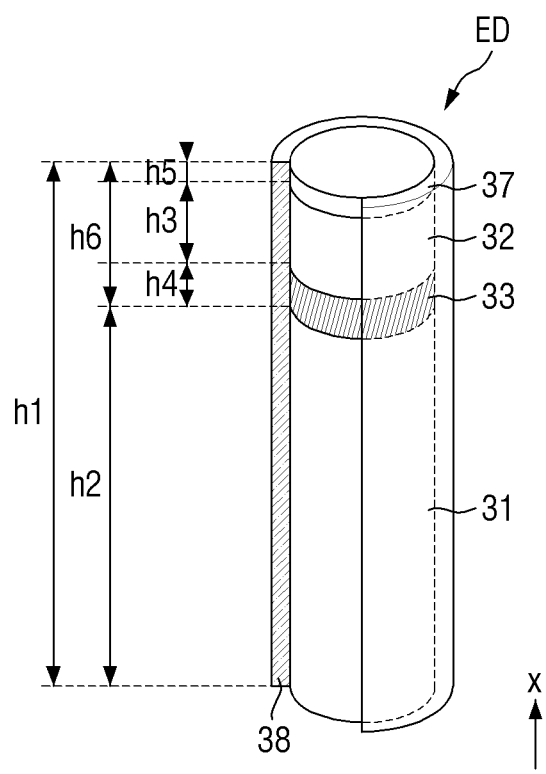
FIG. 6 is a view showing a light-emitting element according to an embodiment of the present disclosure.

FIG. 6 is a view showing a light-emitting element according to an embodiment of the present disclosure.

Referring to FIG. 6, the light-emitting diode ED is a particulate element and may have a rod-like or cylindrical shape with a certain (or predetermined) aspect ratio. The length of the light-emitting diode ED may be larger than the diameter of the light-emitting diode ED, and the aspect ratio may range from, but is not limited to, about 6:5 to about 100:1.

The light-emitting diode ED may have a size of a nanometer scale (from 1 nm to 1 μm) to a micrometer scale (from 1 μm to 1 mm). According to an embodiment of the present disclosure, both the diameter and length of the light-emitting diode ED may have nanometer scales or micrometer scales. In some other embodiments, the diameter of the light-emitting diode ED may have a nanometer scale, while the length of the light-emitting diode ED may have a micrometer scale. In some embodiments, the diameter and/or length of some of the light-emitting diodes ED may have nanometer scales, while the diameter and/or length of some others of the light-emitting diodes ED have micrometer scales.

According to an embodiment of the present disclosure, the light-emitting diode ED may be an inorganic light-emitting diode. The inorganic light-emitting diode may include a plurality of semiconductor layers. For example, the inorganic light-emitting diode may include a first conductivity type (e.g., n-type) semiconductor layer, a second conductivity type (e.g., p-type) semiconductor layer, and an active semiconductor layer interposed therebetween. The active semiconductor layer may receive holes and electrons from the first conductivity-type semiconductor layer and the second conductivity-type semiconductor layer, respectively, and the holes and electrons reaching the active semiconductor layer may be combined to emit light.

According to an embodiment of the present disclosure, the above-described semiconductor layers may be sequentially stacked along one direction X, which is a longitudinal direction of the light-emitting diode ED. The light-emitting diode ED may include a first semiconductor layer 31, an active layer 33, and a second semiconductor layer 32 sequentially stacked in the direction X, as shown in, for example, FIG. 6. The first semiconductor layer 31, the active layer 33, and the second semiconductor layer 32 may be a first conductivity type semiconductor layer, an active semiconductor layer, and a second conductivity type semiconductor layer described above, respectively.

The first semiconductor layer 31 may be doped with a first conductivity type dopant. The first conductivity type dopant may be Si, Ge, Sn, etc. According to an embodiment of the present disclosure, the first semiconductor layer 31 may be n-GaN doped with n-type Si. The first semiconductor layer 31 may occupy most of the volume of the light-emitting diode ED.

The second semiconductor layer 32 may be spaced apart from the first semiconductor layers 31 with the active layer 33 therebetween. The second semiconductor layer 32 may be doped with a second conductivity-type dopant, such as Mg, Zn, Ca, Se, and Ba. According to an embodiment of the present disclosure, the second semiconductor layer 32 may be p-GaN doped with p-type Mg.

The active layer 33 may include a material having a single or multiple quantum well structure. As described above, the active layer 33 may emit light as electron-hole pairs are combined therein in response to an electrical signal applied through the first semiconductor layer 31 and the second semiconductor layer 32.

In some embodiments, the active layer 33 may have a structure in which a semiconductor material having a large band gap energy and a semiconductor material having a small band gap energy are alternately stacked on one another, and the active layer 33 may include other Group III to Group V semiconductor materials depending on the wavelength range of the emitted light.

The light emitted from the active layer 33 may exit not only through the both end surfaces in the longitudinal direction of the light-emitting diode ED but also through the outer peripheral surface (e.g., outer surface or side surface) of the light-emitting diode ED. For example, the direction in which the light emitted from the active layer 33 propagates is not limited to one direction.

The light-emitting diode ED may further include an element electrode layer 37 disposed on the second semiconductor layer 32. The element electrode layer 37 may contact the second semiconductor layer 32. The element electrode layer 37 may be an ohmic contact electrode but is not limited to it. It may be, for example, a Schottky contact electrode.

When the both ends of the light-emitting diode ED are electrically connected to the contact electrodes 710 and 720 through which electric signals are applied to the first and second semiconductor layers 31 and 32, the element electrode layer 37 may be disposed between the second semiconductor layer 32 and the corresponding contact electrode to reduce the resistance therebetween. The element electrode layer 37 may include at least one of aluminum (Al), titanium (Ti), indium (In), gold (Au), silver (Ag), indium tin oxide (ITO), indium zinc oxide (IZO), and indium tin-zinc oxide (ITZO). The element electrode layer 37 may include a semiconductor material doped with n-type or p-type impurities.

The light-emitting diode ED may further include an insulating film 38 surrounding (e.g., extending around) the outer peripheral surfaces of the first semiconductor layer 31, the second semiconductor layer 32, the active layer 33, and/or the element electrode layer 37. The insulating film 38 may be disposed to surround at least the outer surface of the active layer 33 and may be extended in the direction X in which the light-emitting diode ED is extended. The insulating film 38 may protect the above-described elements. The insulating film 38 may include (or may be made of) materials having insulating properties and may prevent or substantially prevent an electrical short-circuit from occurring when the active layer 33 contacts an electrode through which an electric signal is transmitted to the light-emitting diode ED. In addition, because the insulating film 38 protects the active layer 33 and the outer peripheral surfaces of the first and second semiconductor layers 31 and 32, a decrease in luminous efficiency may be mitigated or prevented.

According to an embodiment of the present disclosure, the active layer 33 of the light-emitting diode ED may be shifted from the central area of the light-emitting diode ED in the direction X in which the light-emitting diode ED is extended so that the active layer 33 is located closer to one side of the light-emitting diode ED in the direction X. As described above, the first semiconductor layer 31 may be formed to occupy most of the light-emitting diode ED. For example, the length h2 of the first semiconductor layer 31 in the direction X may be greater than the length h3 of the second semiconductor layer 32 in the direction X, the length h4 of the active layer 33 in the direction X, and the length h5 of the element electrode layer 37 in the direction X. Moreover, the length h2 of the first semiconductor layer 31 in the direction X may be greater than the sum of the length h3 of the second semiconductor layer 32 in the direction X and the length h5 of the element electrode layer 37 in the direction X. In some embodiments, the length h2 of the first semiconductor layer 31 in the direction X may be greater than the sum h6 of the length h3 of the second semiconductor layer 32 in the direction X, the length h4 of the active layer 33 in the direction X, and the length h5 of the element electrode layer 37 in the direction X.

The length h2 of the first semiconductor layer 31 in the direction X may be greater than one-half of the length h1 of the light-emitting diode ED in the direction X. Accordingly, the active layer 33, which is disposed between the first semiconductor layer 31 and the second semiconductor layer 32, may be shifted from the center of the light-emitting diode ED in the direction X so that it is located closer to the one side in direction X (e.g., the side at where the second semiconductor layer 32 is disposed). Because the active layer 33 is located closer to the one side in the longitudinal direction of the light-emitting diode ED, the intensity of light emitted from the active layer 33 through the both end surfaces and the outer peripheral surface of the light-emitting diode ED may be greater at the end nearer to the active layer 33 than at the opposite end of the light-emitting diode ED. In addition, the intensity of light emitted through the outer circumferential surface of the light-emitting diode ED may be greater at the first end of the light-emitting disposed ED, to which the active layer 33 is closer, than at the second end thereof.

Figure 8:
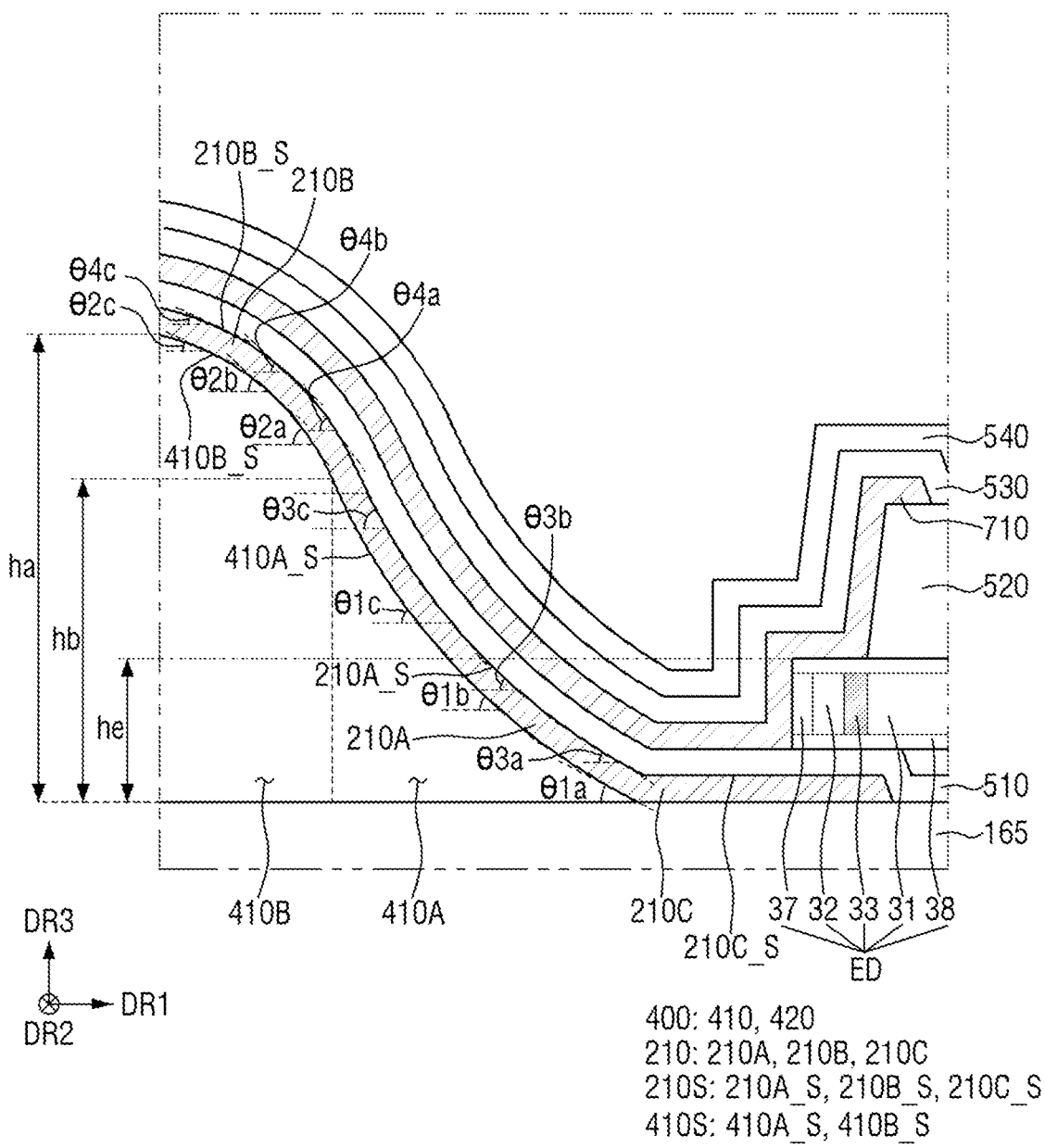
FIG. 8 is an enlarged cross-sectional view of a portion of FIG. 7.

FIG. 7 is an enlarged, cross-sectional view showing the area A of FIG. 4, and FIG. 8 is an enlarged cross-sectional view of a part of FIG. 7.

Referring to FIGS. 7 and 8, as described above, each of the first sub-bank 410 and the second sub-bank 420 may have a shape protruding from the via layer 165, and at least a part of the shape of each of the first sub-bank 410 and the second sub-bank 420 that faces the light-emitting diode ED may have a concave curved shape.

The first areas 410A and 420A of the first and second sub-banks 410 and 420 facing the both ends of the light-emitting diode ED, respectively, may have a concave curved shape in a cross section of the light-emitting diode while the second areas 410B and 420B of the first and second sub-banks 410 and 420 may have a concave curved shape in the cross section of the light-emitting diode. Each of the first and second sub-banks 410 and 420 may have a cross-sectional shape having an inclination angle of the outer surface that varies along the third direction DR3. The inclination angle of each of the first and second sub-banks 410 and 420 may be measured as the slope of a tangent line on the outer surface thereof. Each of the first areas 410A and 420A of the first and second sub-banks 410 and 420 may have a cross-sectional shape in which the inclination angle of the outer surface (or surface) increases along the third direction DR3. Each of the second areas 410B and 420B of the first and second sub-banks 410 and 420 may have a cross-sectional shape in which the inclination angle of the outer surface (or surface) decreases along the third direction DR3.

The inclination angle of an outer surface 410S of the first sub-bank 410 may vary along the third direction DR3. For example, the inclination angle of an outer surface 410A_S of the first area 410A of the first sub-bank 410 may increase along the third direction DR3. For example, the first to third inclination angles $\theta1a$, $\theta1b$, and $\theta1c$ of the outer surface 410A_S of the first area 410A of the first sub-bank 410 may be different from one another. In addition, the first to third inclination angles $\theta1a$, $\theta1b$, and $\theta1c$ of the outer surface 410A_S of the first area 410A of the first sub-bank 410 sequentially measured in the third direction DR3 may increase along the third direction DR3, as shown in FIG. 8.

The inclination angle of an outer surface 410B_S of the second area 410B of the first sub-bank 410 may decrease along the third direction DR3. For example, the first to third inclination angles $\theta2a$, $\theta2b$, and $\theta2c$ of the outer surface 410B_S of the second area 410B of the first sub-bank 410 may be different from one another. In addition, the first to third inclination angles $\theta2a$, $\theta2b$, and $\theta2c$ of the outer surface 410B_S of the second area 410B of the first sub-bank 410 sequentially measured in the third direction DR3 may decrease along the third direction DR3, as shown in FIG. 8.

It is to be understood that the foregoing description can be equally applied to the first and second areas 420A and 420B of the second sub-bank 420.

As described above, the first electrode 210 and the second electrode 220 may be disposed on the first and second sub-banks 410 and 420, respectively, and the via layer 165. The first and second electrodes 210 and 220 may be disposed on the first and second sub-banks 410 and 420, respectively, and the via layer 165, and may have the cross-sectional shape of the surface conforming to the cross-sectional shape of the surface of the first and second sub-banks 410 and 420 or the via layer 165 disposed thereunder. For example, the cross-sectional shapes of the surfaces of the first electrode 210 and the second electrode 220 may conform to the shapes of the outer surfaces (or surfaces) of the first and second sub-banks 410 and 420, respectively, and/or the via layer 165 disposed thereunder.

The first electrode 210 may have a first section 210A disposed on the first area 410A of the first sub-bank 410, a second section 210B disposed on the second area 410B of the first sub-bank 410, and a third section 210C disposed on the via layer 165 between the first sub-bank 410 and the second sub-bank 420.

The first section 210A of the first electrode 210 may overlap the first area 410A of the first sub-bank 410 in the third direction DR3. The cross-sectional shape of the surface of the first section 210A of the first electrode 210 may conform to the shape of the outer surface of the first area 410A of the first sub-bank 410. The cross-sectional shape of the surface of the first section 210A of the first electrode 210 may have a concave curved shape, similarly to the first area 410A of the first sub-bank 410.

The second section 210B of the first electrode 210 may overlap the second area 410B of the first sub-bank 410 in the third direction DR3. The cross-sectional shape of the surface of the second section 210B of the first electrode 210 may conform to the shape of the outer surface of the second area 410B of the first sub-bank 410. The cross-sectional shape of the surface of the second section 210B of the first electrode 210 may have a convex curved shape, similarly to the second area 410B of the first sub-bank 410.

The third section 210C of the first electrode 210 may be disposed on the via layer 165 between the first sub-bank 410 and the second sub-bank 420. The cross-sectional shape of the surface of the third section 210C of the first electrode 210 may have a shape corresponding to the shape of the outer surface of the via layer 165. For example, the surface of the third section 210C of the first electrode 210 may be flat, similarly to the via layer 165.

The inclination angle of an outer surface 210S of the first electrode 210 may vary along the third direction DR3. For example, the inclination angle of an outer surface 210A_S of the first section 210A of the first electrode 210 may increase along the third direction DR3. For example, the first to third inclination angles θ3a, θ3b, and θ3c of the outer surface 210A_S of the first section 210A of the first electrode 210 may be different from one another. In addition, the first to third inclination angles θ3a, θ3b, and θ3c of the outer surface 210A_S of the first section 210A of the first electrode 210 sequentially measured in the third direction DR3 may increase along the third direction DR3, as shown in FIG. 8.

The inclination angle of an outer surface 210B_S of the second section 210B of the first electrode 210 may decrease along the third direction DR3. For example, the first to third inclination angles θ4a, θ4b, and θ4c of the outer surface 210B_S of the second section 210B of the first electrode 210 may be different from one another. In addition, the first to third inclination angles θ4a, θ4b, and θ4c of the outer surface 210B_S of the second section 210B of the first electrode 210 sequentially measured in the third direction DR3 may decrease along the third direction DR3, as shown in FIG. 8.

The direction in which the light-emitting diode ED is extended may be parallel to the upper surface of the substrate SUB. The plurality of semiconductor layers included in the light-emitting diode ED may be sequentially arranged along the direction parallel to the upper surface of the substrate SUB. For example, the first semiconductor layer 31, the active layer 33, and the second semiconductor layer 32 of the light-emitting diode ED may be arranged sequentially parallel to the upper surface of the substrate SUB.

Light generated in (and emitted from) the active layer 33 of the light-emitting diode ED may exit through the both end surfaces of the light-emitting diode ED and the outer peripheral surface of the light-emitting diode ED. Light exiting through the both end surfaces of the light-emitting diode ED may be incident on the first bank 400. In such a case, the direction in which the light emitted from the light-emitting diode ED travels (e.g., is reflected to travel or propagate) may be determined based on the shape of the outer surface of the first bank 400 that faces the light-emitting diode ED. For example, first and second electrodes 210 and 220, acting as reflective layers that reflect light emitted from the light-emitting diode ED toward the display side, are disposed on the first and second sub-banks 410 and 420 to reflect (or have) the surface shapes of the elements disposed thereunder, and thus, the direction in which the light emitted from the light-emitting diode ED travels may be determined according to the shape of the outer surface of the first and second sub-banks 410 and 420 facing the both ends of the light-emitting diode ED, respectively.

According to this embodiment, the outer surfaces of the first areas 410A and 420A of the first and second sub-banks 410 and 420 facing the both ends of the light-emitting diode ED may have concave curved shapes, respectively. Accordingly, the surfaces of the first and second electrodes 210 and 220 disposed on the first areas 410A and 420A of the first and second sub-banks 410 and 420 may have concave curved shapes, respectively. Because the cross-sectional shapes of the surfaces of the first section 210A and 220A of the first and second electrodes 210 and 220 facing the both ends of the light-emitting diode ED are concave curved shapes, the incident angle of the light emitted from the light-emitting diode ED to be incident on the first sections 210A and 220A of the first and second electrodes 210 and 220 may decrease compared to the incident angle of a convex curved shape. Accordingly, the amount of light emitted from the light-emitting diode ED and directed toward the display side is increased and may be more efficiently concentrated. As a result, luminous efficiency of each sub-pixel SPX can be improved.

A height hb of the first area 410A of the first sub-bank 410 may be smaller than a height ha of the first sub-bank 410. In addition, the height hb of the first area 410A of the first sub-bank 410 may be greater than a height he from the upper surface of the via layer 165 to the upper surface of the light-emitting diode ED in a cross section. Because the height hb of the first area 410A of the first sub-bank 410 is greater than the height he from the upper surface of the via layer 165 to the upper surface of the light-emitting diodes ED in the cross section, even when light emitted through both end surfaces of the light-emitting diode ED has a certain directivity angle, the light can be incident on the first area 410A of the first sub-bank 410. Accordingly, the efficiency of collecting light emitted from the light-emitting diode ED using the first section 210A of the first electrode 210 having the concave curved shape can be improved.

As described above, the first electrode 210 and the second electrode 220 may protrude from (or extend beyond) the first sub-bank 410 and the second sub-bank 420, respectively, to the area between the first sub-bank 410 and the second sub-bank 420. The width d1 of the portion of the first electrode 210 extended from the first sub-bank 410 into the area between the first sub-bank 410 and the second sub-bank 420 may be greater than the width d2 of the portion of the second electrode 220 extended from the second sub-bank 420 into the area between the first sub-bank 410 and the second sub-bank 420. That is to say, the width d1 of the portion of the first electrode 210 extended from the first sub-bank 410 into the area between the first sub-bank 410 and the second sub-bank 420 may be greater than the width d2 of the portion of the second electrode 220 extended from the second sub-bank 420 into the area between the first sub-bank 410 and the second sub-bank 420.

The first electrode 210 may overlap the first end of the light-emitting diode ED in the third direction DR3 under the light-emitting diode ED, and the second electrode 220 may overlap the second end of the light-emitting diode ED in the third direction DR3 under the light-emitting diode ED. The width w1 at where the first electrode 210 overlaps the first end of the light-emitting diode ED in the third direction DR3 may be larger than the width w2 at where the second electrode 220 overlaps the second end of the light-emitting diode ED in the third direction DR3. For example, the light-emitting diode ED may be disposed at the center of the area between the first sub-bank 410 and the second sub-bank 420. Accordingly, a third horizontal distance d3 between the first sub-bank 410 and the first end of the light-emitting diode ED may be equal to a fourth horizontal distance d4 between the second sub-bank 420 and the second end of the light-emitting diode ED. Although the light-emitting diode ED is disposed generally at the center between the first sub-bank 410 and the second sub-bank 420, the first electrode 210 and the second electrode 220 are formed such that the width d1 of the first electrode 210 at where it protrudes from the first sub-bank 410 into the area between the first sub-bank 410 and the second sub-bank 420 is greater than the width d2 of the second electrode 220 at where it protrudes from the second sub-bank 420 into the area between the first sub-bank 410 and the second sub-bank 420. Accordingly, the width w1 at where the first electrode 210 overlaps the first end of the light-emitting diode ED in the third direction DR3 may be greater than the width w2 at where the second electrode 220 overlaps the second end of the light-emitting diode ED in the third direction DR3.

In addition, the width w1 at where the first electrode 210 overlaps the first end of the light-emitting diode ED in the third direction DR3 may be larger than a distance h6 from the first end of the light-emitting diode ED to the first semiconductor layer 31. Therefore, the width w1 at where the first electrode 210 overlaps the first end of the light-emitting diode ED in the third direction DR3 is greater than the width w2 at where the second electrode 220 overlaps the second end of the light-emitting diode ED in the third direction DR3 and the distance h6 from the first end of the light-emitting diode ED to the first semiconductor layer 31; thus, the first electrode 210 may cover (e.g., may extend entirely beneath) the active layer 33 of the light-emitting diode ED under the light-emitting diode ED. Accordingly, light emitted from the active layer 33 of the light-emitting diodes ED and traveling downwardly can be reflected by the first electrode 210 to improve light emission efficiency.

Figure 9:
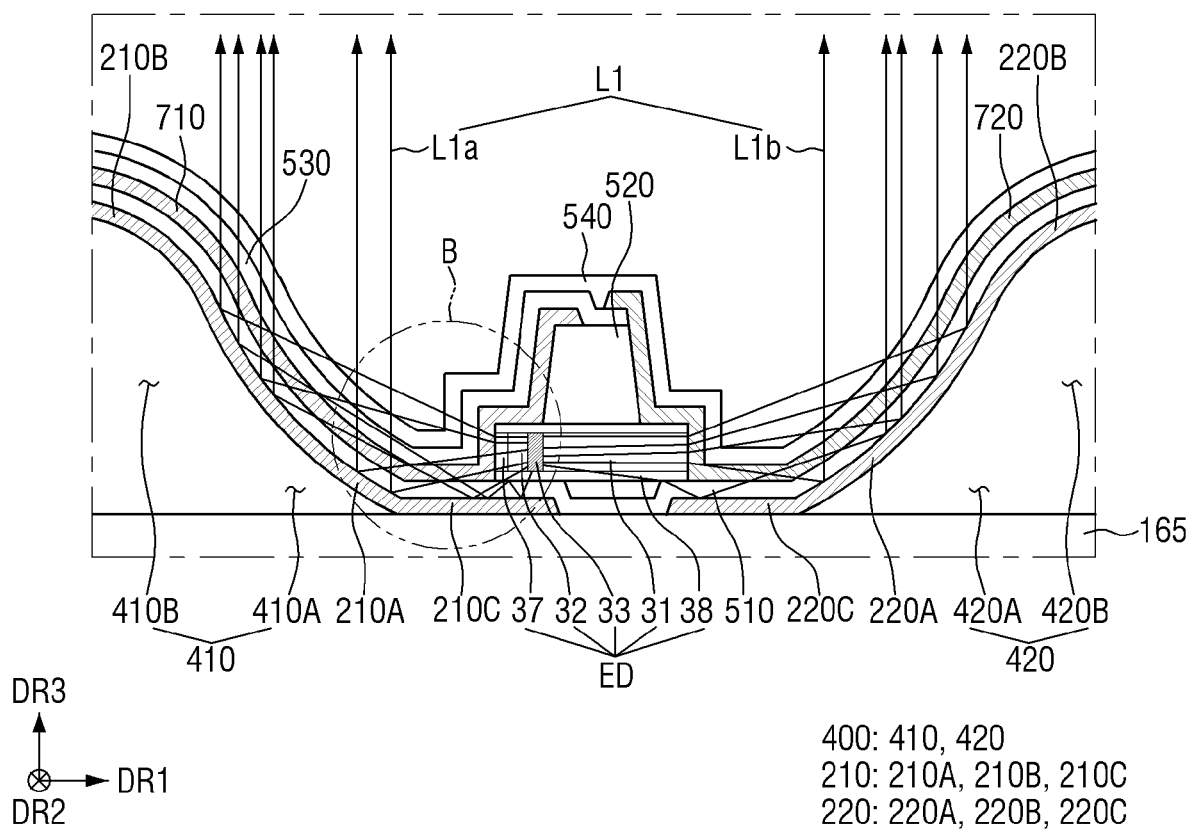
FIG. 9 is a cross-sectional view illustrating propagation paths of light emitted from a light-emitting diode of a display device according to an embodiment.
Figure 10:
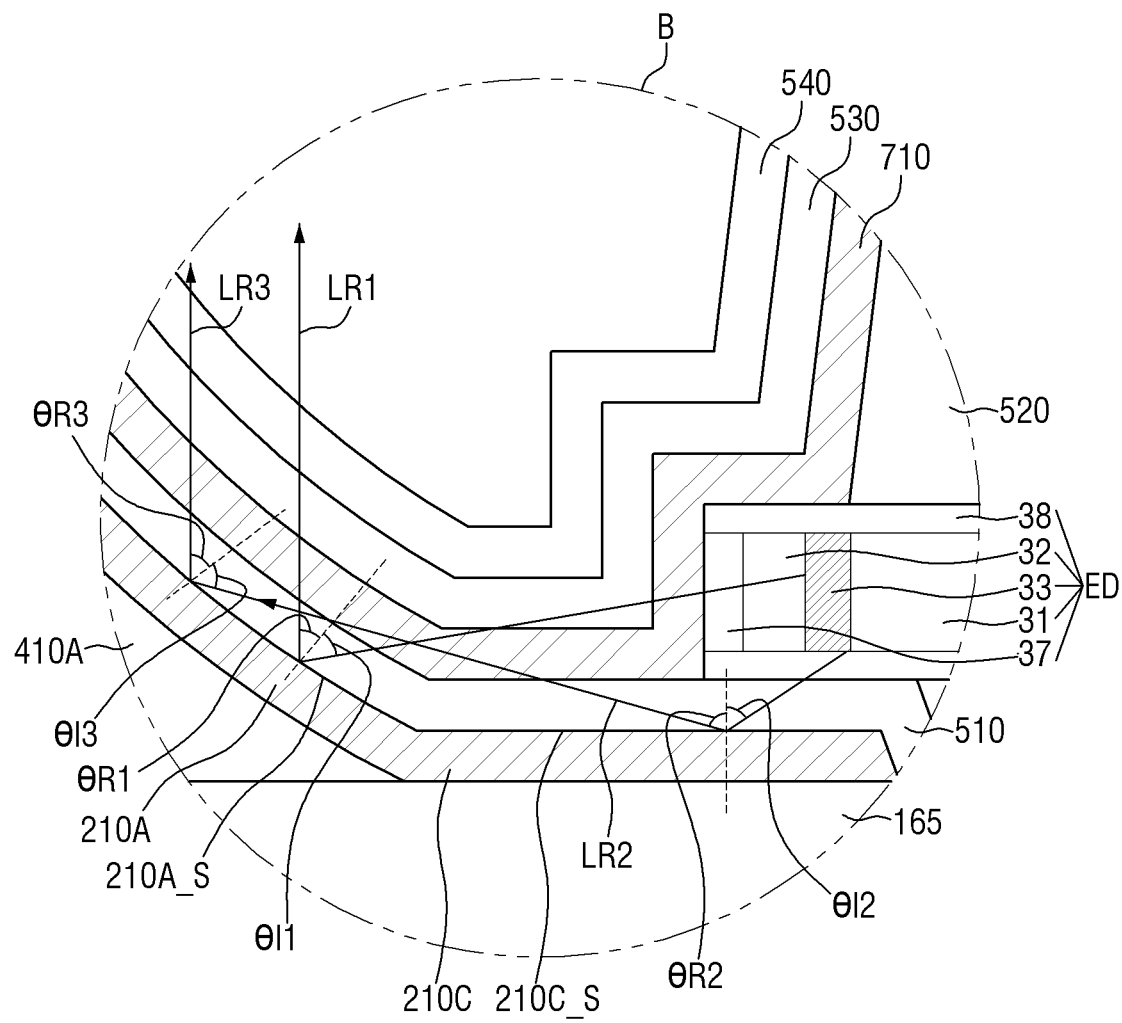
FIG. 10 is an enlarged, cross-sectional view showing an example of the area B of FIG. 9.

FIG. 9 is a cross-sectional view illustrating directions in which light emitted from a light-emitting diode ED of a display device according to an embodiment travel (or propagate). FIG. 10 is an enlarged, cross-sectional view showing the area B of FIG. 9.

Referring to FIGS. 9 and 10, paths in which the light emitted from the light-emitting diode ED transmit a plurality of insulating layers and/or the contact electrodes 710 and 720 and then are reflected by the first electrode 210 and the second electrode 220 will be described in detail.

Referring to FIGS. 9 and 10, first light L1 generated in the active layer 33 of the light-emitting diode ED and exiting through both end surfaces may be incident on the first and second areas 410A and 420A of the first and second sub-banks 410 and 420. For example, first light L1a exiting through one end surface of the light-emitting diode ED may be incident on the first area 410A of the first sub-bank 410, and first light L1b exiting through the opposite end surface of the light-emitting diode ED may be incident on the first area 420A of the second sub-bank 420. The first light L1a incident on the first area 410A of the first sub-bank 410 and the first light L1b incident on the first area 420A of the second sub-bank 420 may transmit (e.g., may transmit through) the transparent insulating layers 510 and 530 and the first and second contact electrodes 710 and 720 to be incident on the surfaces of the first and second electrodes 210 and 220. The surfaces of the first sections 210A and 220A of the first and second electrodes 210 and 220 disposed on the first areas 410A and 420A of the first and second sub-banks 410 and 420 have concave curved surface shapes, and thus, the first incident angle θI1 of the first light L1 may be smaller than the convex curved shape. Accordingly, because the first reflection angle θR1 of the reflected light LR1 has the angle equal to the first incident angle θI1 of the first light L1, the efficiency of collecting the reflected light LR1 can be improved.

In addition, most of the light generated from the active layer 33 of the light-emitting diode ED and exiting through the outer circumferential surface may be closer to the active layer 33. Accordingly, from among the light exiting through the outer circumferential surface of the light-emitting diode ED, the second light L2 traveling downwardly may be reflected by the first electrode 210 disposed thereunder. The second light L2 traveling downwardly from the outer circumferential surface of the light-emitting diode ED may be incident on the third section 210C of the first electrode 210 with a second incident angle θI2 and may be reflected at the surface 210C_S of the third section 210C of the first electrode 210 with a second reflection angle θR2 to be incident on the first section 210A of the first electrode 210 with a third incident angle θI3. Because the reflected light LR2 incident with the third incident angle θI3 has the angle equal to the third incident angle θI3 of the reflected light LR2, it is reflected and the efficiency of collecting the reflected light LR3 of the second light L2 can be improved.

Figure 11:
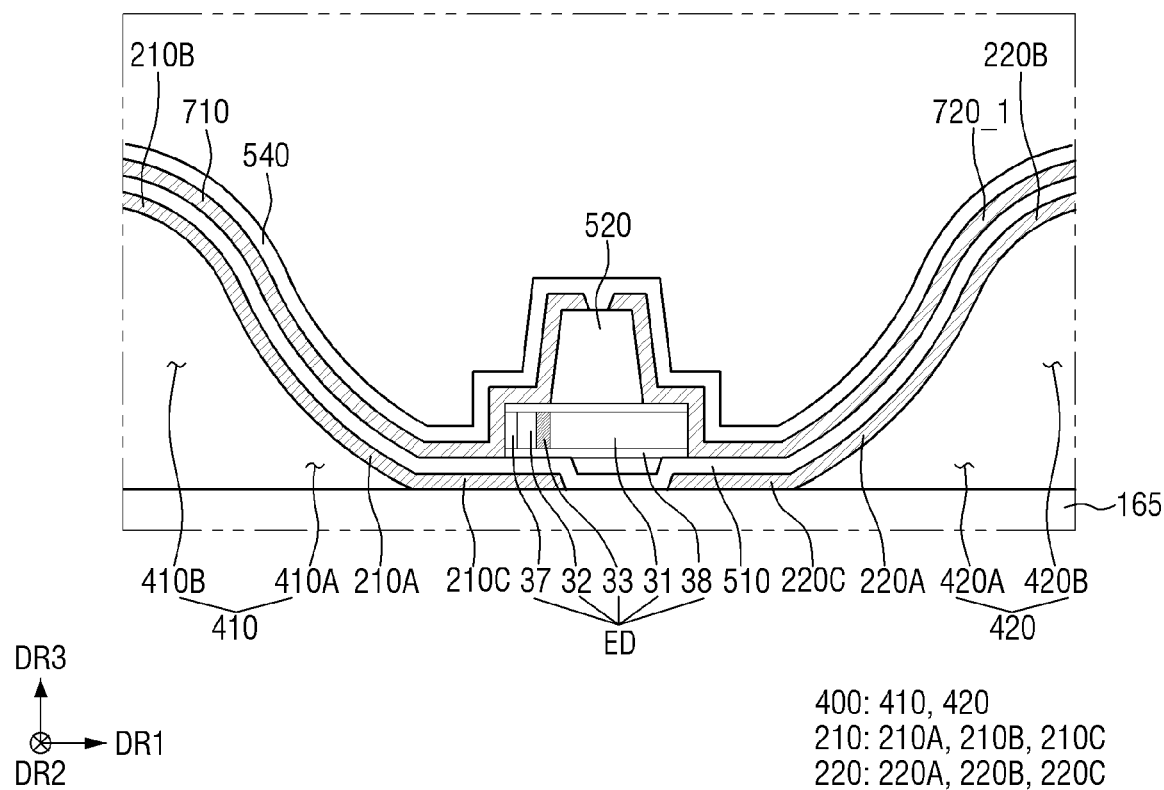
FIG. 11 is an enlarged, cross-sectional view showing the area A of FIG. 4. according to another embodiment

FIG. 11 is an enlarged, cross-sectional view showing the area A of FIG. 4 according to another embodiment.

The embodiment shown in FIG. 11 is different from the embodiment shown in FIG. 7 in that the third insulating layer 530 is omitted.

For example, the first and second contact electrodes 710 and 720_1 may be disposed directly on the second insulating layer 520. The first contact electrode 710 and the second contact electrode 720_1 may be spaced apart from each other on the second insulating layer 520 to expose a portion of the second insulating layer 520. The exposed portion of the second insulating layer 520 between the first and second contact electrodes 710 and 720_1 may contact the fourth insulating layer 540.

According to this embodiment, even though the third insulating layer 530 is omitted, the second insulating layer 520 includes an insulating material to fix the light-emitting diode ED. The first contact electrode 710 and the second contact electrode 720_1 may be patterned via a single mask process and formed together (e.g., formed concurrently or simultaneously). Therefore, no additional mask process is required to form the first contact electrode 710 and the second contact electrodes 720_1, and thus, the efficiency of the process of fabricating the display device 10 can be improved. This embodiment is identical to the embodiment of FIG. 7 except that the third insulating layer 530 is omitted; and, therefore, redundant descriptions will be omitted.

FIGS. 12 to 19 are cross-sectional views showing processing steps of fabricating a display device according to an embodiment of the present disclosure.

Figure 12:
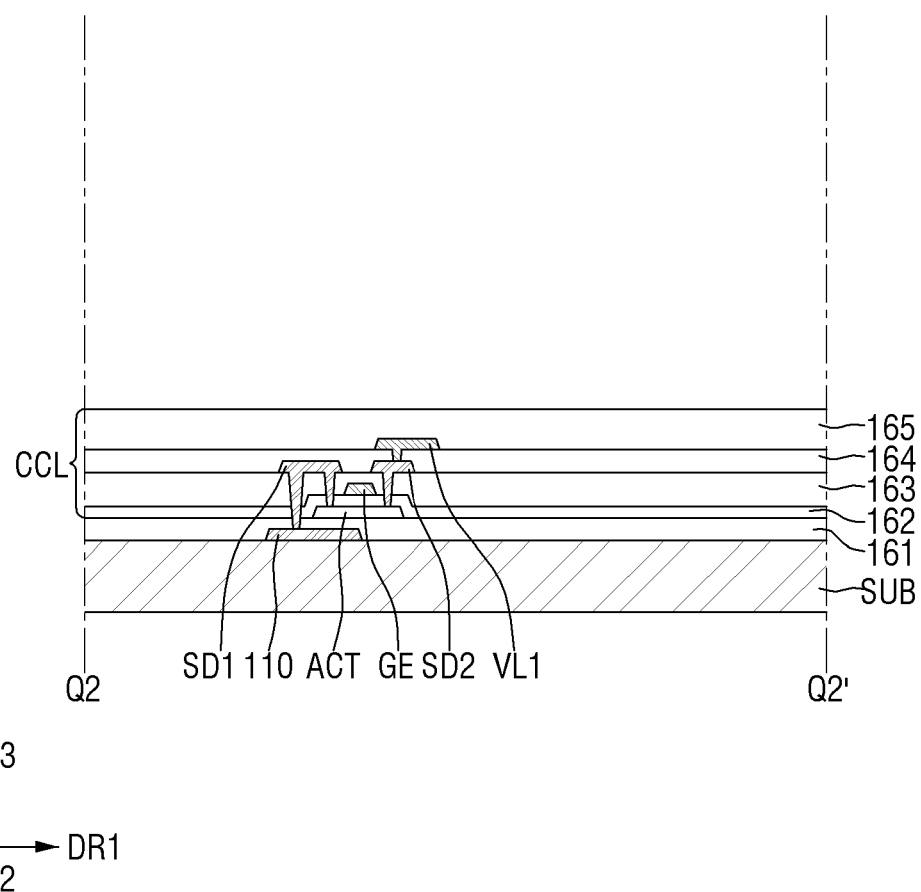
FIGS. 12 to 19 are cross-sectional views showing processing steps of a method of fabricating a display device according to an embodiment of the present disclosure.

Initially, referring to FIG. 12, a substrate SUB is prepared, and a circuit layer CCL is formed on the substrate SUB. The circuit layer CCL may include a buffer layer 161, a bottom metal layer 110, first to third conductive layer, a semiconductor layer, a gate insulator 162, first and second interlayer dielectric layers 163 and 164, and a via layer 165. First and second electrode contact openings CT1 and CT2 may be formed through the via layer 165 to expose the first conductive pattern CDP and the second voltage line VL2 as discussed above with respect to, for example, FIG. 4. The semiconductor layer, the plurality of conductive layers, and the insulating layers may be formed via typical processes well known in the art. Therefore, a detailed description thereof will be omitted.

Figure 13:
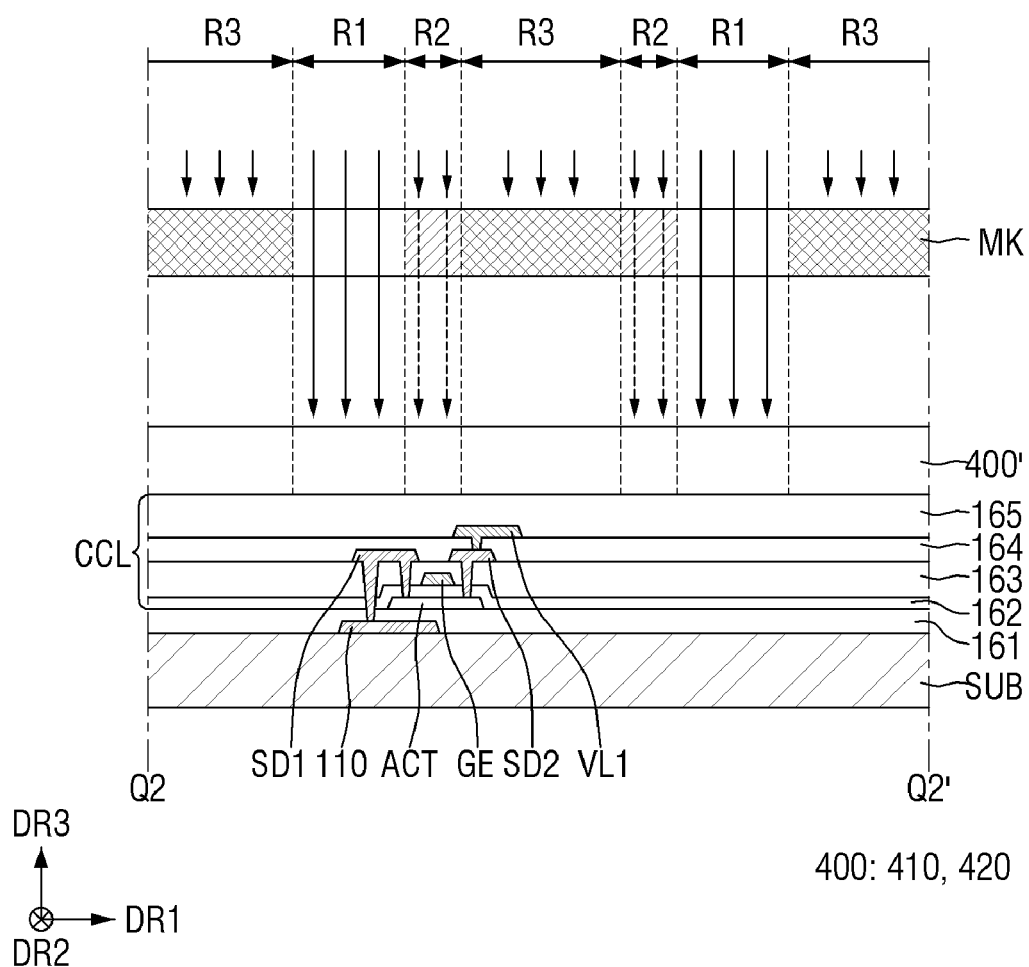

Subsequently, referring to FIG. 13, a material layer 400' for a first bank is formed on the via layer 165. The material layer 400' for the first bank may be applied entirely on the substrate SUB.

Subsequently, the material layer 400' is exposed to light and developed using a light mask MK so that the first bank 400 including the patterned first and second sub-banks 410 and 420 can be formed.

Initially, the light mask MK is prepared (or arranged) above the substrate SUB.

The light mask MK may include a plurality of regions R1, R2, and R3 having different light transmittances. The light mask MK may include a first light-transmitting region R1, a second light-transmitting region R2, and a light-blocking region R3 according to the transmittances of light. The transmittance of the light-blocking region R3 may be lower than that of each of the first and second light-transmitting regions R1 and R2. For example, the light-blocking region R3 may block substantially all of the light provided from the outside (e.g., may have a transmittance of approximately 0%), the first light-transmitting region R1 may transmit substantially all of the light provided from the outside (e.g., may have a transmittance of approximately 100%), and the second light-transmitting region R2 may transmit some of the light provided from the outside (e.g., may have a transmittance of approximately 20% to 30%). It is, however, to be understood that the present disclosure is not limited thereto. The light-blocking region R3 may transmit some of the light with a light transmittance significantly lower than that of each of the first and second light-transmitting regions R1 and R2.

Subsequently, the light mask MK may be placed above the material layer 400', and an exposure process may be carried out.

The light mask MK may be disposed such that the light-blocking region R3 is in line with (e.g., is aligned over) an area where the first bank 400 is not formed, the second light-transmitting region R2 is in line with areas where the first areas 410A and 420A of the first bank 400 are formed, and the first light-transmitting region R1 is in line with areas where the second areas 410B and 420B of the first bank 400 are formed. For example, the area where the material layer 400' for the first bank remains and a concave curved shape is required may be in line with the second light-transmitting region R2, the area where the material layer 400' for the first bank remains but a concave curved shape is not required may be in line with the first light-transmitting region R1, and the area where the material layer 400' for the first bank is to be removed may be in line with the light-blocking region R3.

The light-blocking region R3 can block light provided from the outside so that the light does not reach the material layer 400' overlapping the area where the first bank 400 should not be formed. In addition, the second light-transmitting region R2 can allow only some of the light to reach the material layer 400' overlapping the area where the material layer 400' remains and a concave curved shape is to be formed. In addition, the first light-transmitting region R1 can allow most of the light to reach the material layer 400' overlapping the area where the material layer 400' remains but a concave curved shape is to be formed. As the chemical characteristics of the material layer 400' change differently depending on whether it is exposed to light or not, it is possible to selectively remove some regions of it while leaving other regions by using a developing solution.

Figure 14:
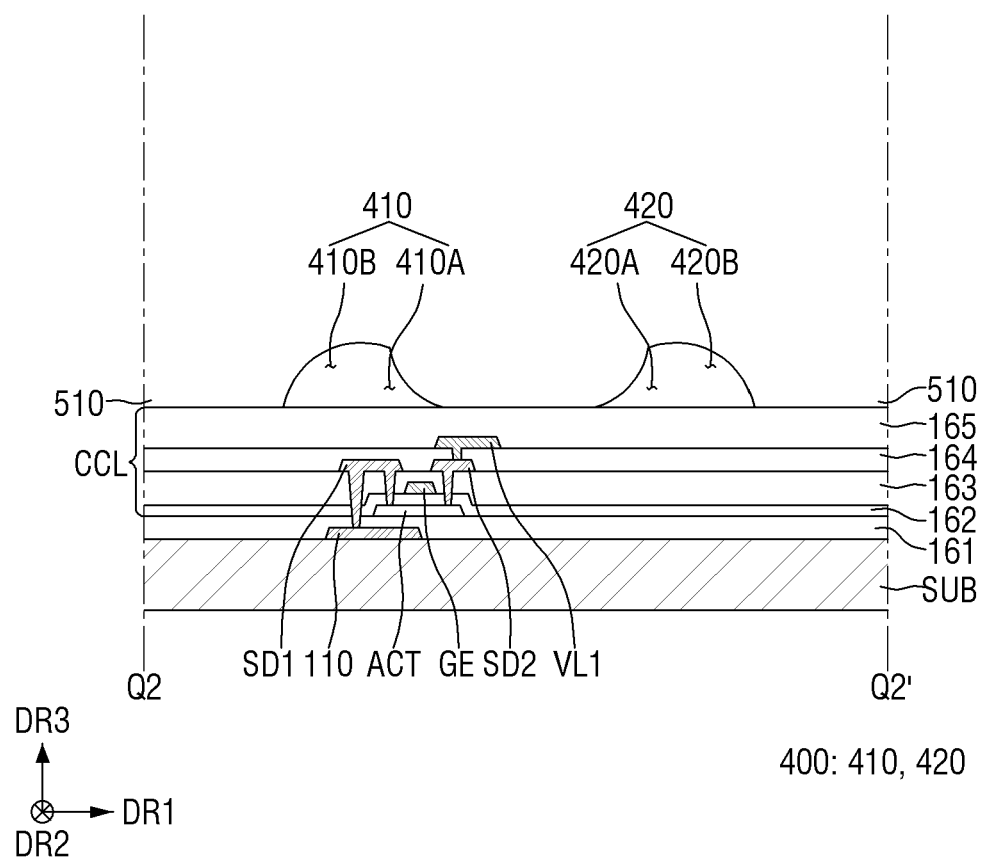

Accordingly, via the exposure process and development, the material layer 400' in line with the light-blocking region R3 may be removed, the second areas 410A and 420B of the first and second sub-bank 410 and 420 may be formed at the area in line with the first light-transmitting region R1, and the first areas 410A and 420B of the first and second sub-bank 410 and 420 may be formed at the area in line with the second light-transmitting region R2, as shown in FIG. 14.

Figure 15:
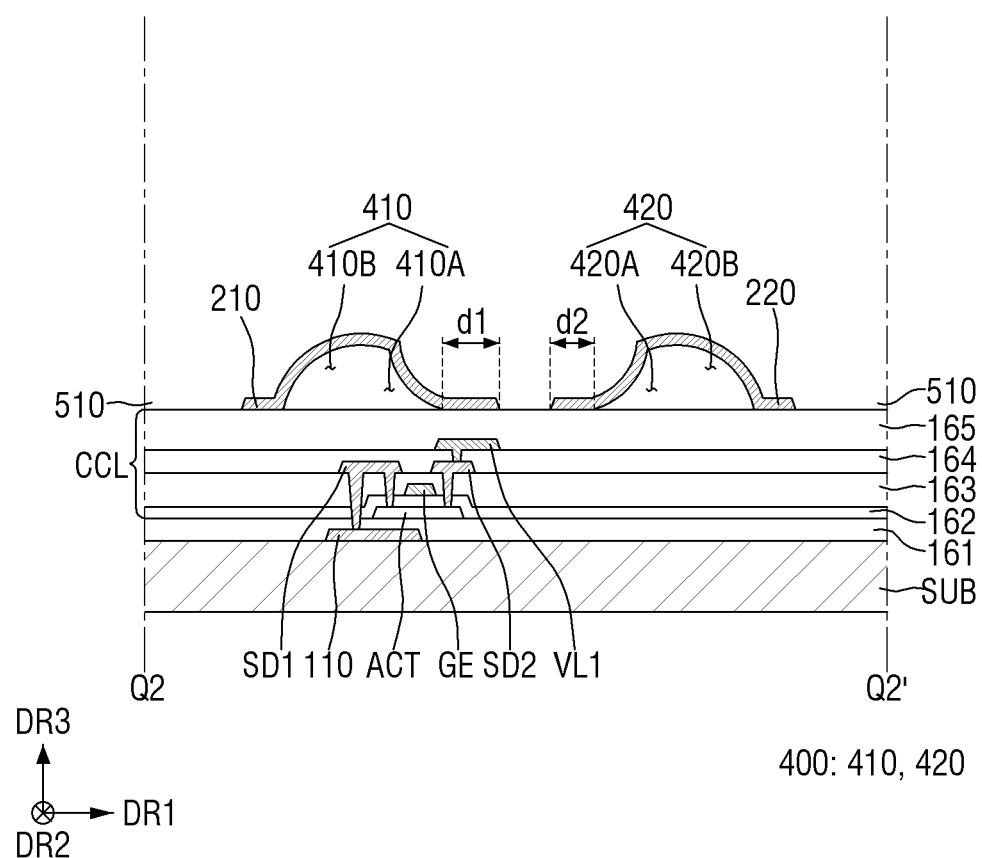

Subsequently, referring to FIG. 15, a first electrode 210 and a second electrode 220 may be formed on the first bank 400. The patterned first electrode 210 and second electrode 220 may be formed via a mask process. For example, a material layer for an electrode layer is deposited entirely on the first bank 400 (and, in some embodiments, on the via layer 165). During the deposition process, the material layer for the electrode layer may be deposited up to the inside of the first and second electrode contact openings CT1 and CT2 penetrating the via layer 165 and may be connected to the first conductive pattern CDP and the second voltage line VL2 thereunder. Subsequently, after applying a photoresist layer on the material layer for the electrode, a photoresist pattern is formed by exposure and development, and then the material layer for the electrode is etched using the photoresist pattern as an etching mask. Subsequently, the photoresist pattern is removed via a strip process or an ashing process, to form the patterned first electrode 210 and second electrode 220, as shown in FIG. 15.

As described above, the first electrode 210 and the second electrode 220 may be formed such that the width d1 of the portion of the first electrode 210 extended from the first sub-bank 410 into the area between the first sub-bank 410 and the second sub-bank 420 may be different from the width d2 of the portion of the second electrode 220 extended from the second sub-bank 420 into the area between the first sub-bank 410 and the second sub-bank 420. For example, the first electrode 210 and the second electrode 220 may be formed such that the width d1 of the portion of the first electrode 210 extended from the first sub-bank 410 into the area between the first sub-bank 410 and the second sub-bank 420 may be greater than the width d2 of the portion of the second electrode 220 extended from the second sub-bank 420 into the area between the first sub-bank 410 and the second sub-bank 420.

Figure 16:
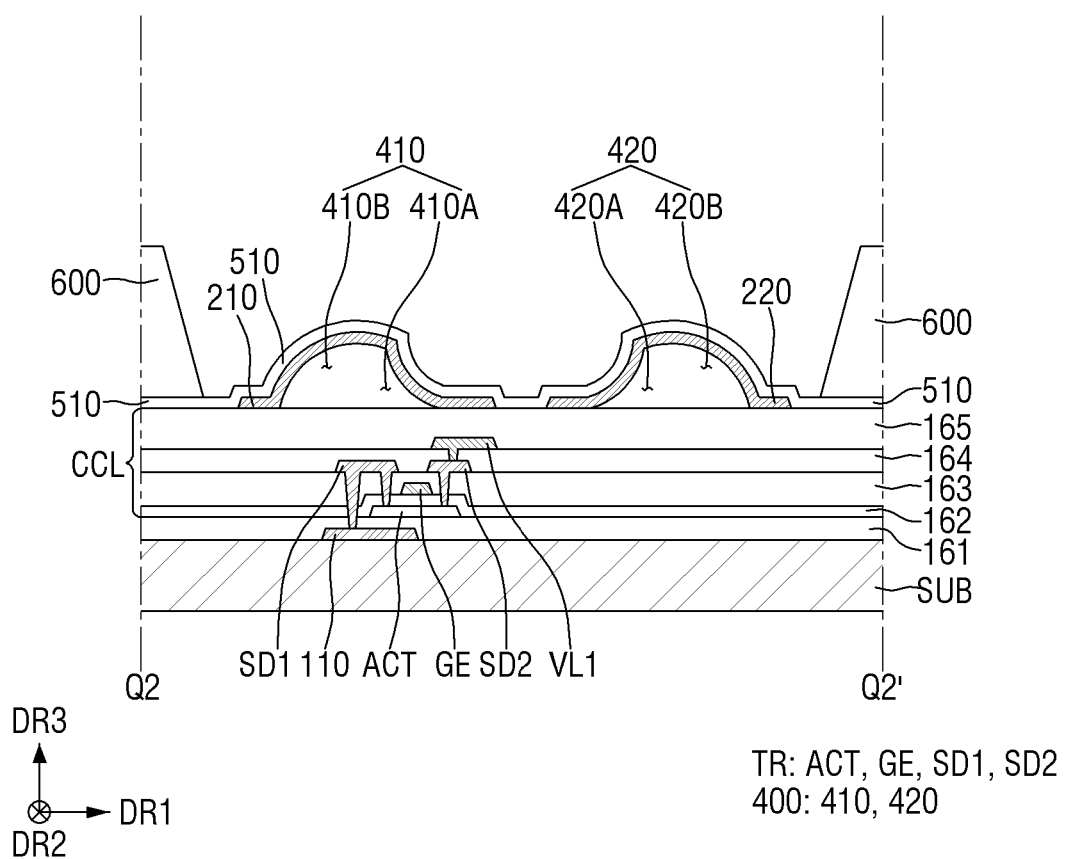

Subsequently, as shown in FIG. 16, a first insulating layer 510 is formed on the first and second electrodes 210 and 220, and a second bank 600 is formed. The first insulating layer 510 may be disposed to entirely cover the first electrode 210 and the second electrode 220 on the substrate SUB and may be partially patterned during a subsequent process to form the first insulating layer 510 as shown in, for example, FIGS. 4 and 5.

Figure 17:
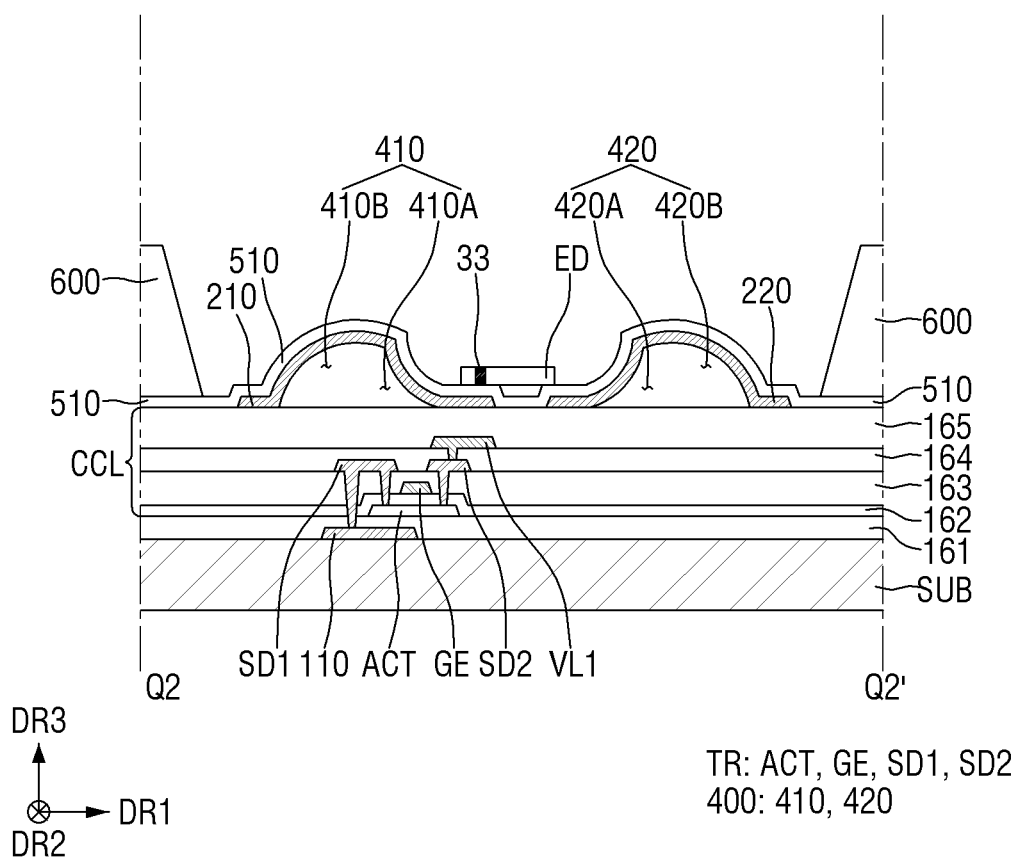

Subsequently, as shown in FIG. 17, a light-emitting diode ED is disposed between the first sub-bank 410 and the second sub-bank 420. The light-emitting diode ED may be disposed by using an inkjet process. For example, an ink in which the light-emitting diodes ED are dispersed is ejected into the emission area EMA partitioned by the second bank 600, and an alignment signal is applied between the first electrode 210 and the second electrode 220. Then, by using an electric field formed therebetween, the light-emitting diode ED may be aligned such that the both ends thereof are placed on the first electrode 210 and the second electrode 220, respectively.

Figure 18:
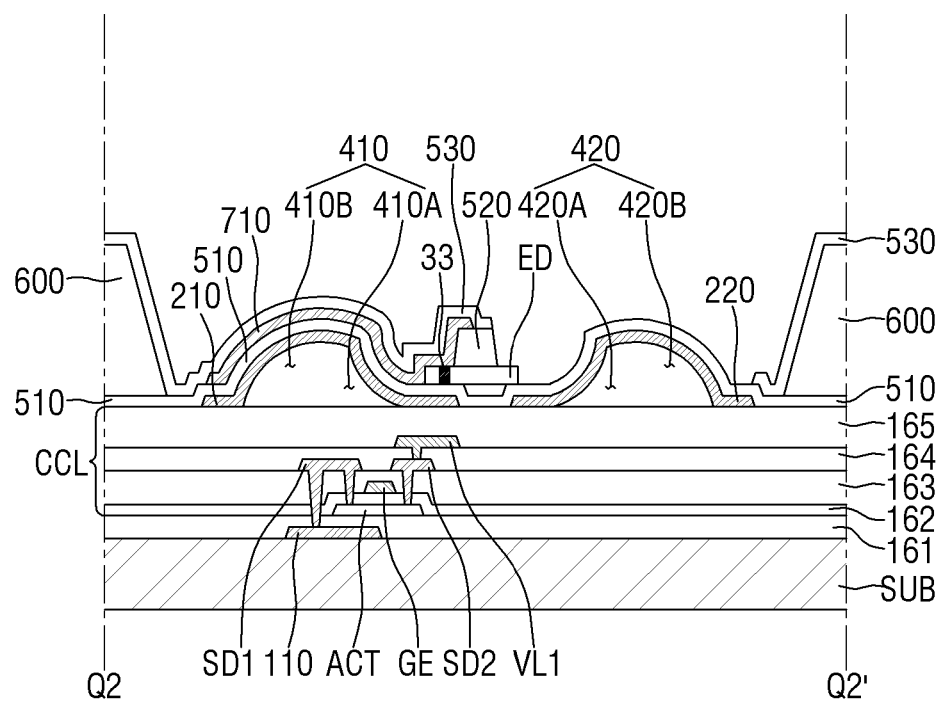

Subsequently, as shown in FIG. 18, a second insulating layer 520, a first contact electrode 710, and a third insulating layer 530 are formed on the light-emitting diode ED.

Initially, the second insulating layer 520 shown in FIG. 18 may be formed by stacking a second insulating material layer entirely on the substrate SUB on which the light-emitting diodes ED and the first insulating layer 510 are formed and removing a portion of the second insulating material layer so that the first ends and the second ends of the light-emitting diodes ED are exposed.

Subsequently, a first contact electrode 710 is formed on the second insulating layer 520. In an embodiment, the first contact electrode 710 may be formed via a mask process. For example, a material layer for the first contact electrode is disposed entirely on the substrate SUB. Subsequently, a photoresist layer is applied onto the material layer for the first contact electrode, and a photoresist pattern is formed by exposure and development. Then, etching is carried out by using the photoresist pattern as an etch mask. The material layer for the first contact electrode may be etched entirely by, but is not limited to, wet etching. Subsequently, the photoresist pattern may be removed via a strip process or an ashing process to form the first contact electrode 710 as shown in, for example, FIG. 18.

Subsequently, a third insulating layer 530 is formed on the first contact electrode 710. The patterned third insulating layer 530 may be formed by depositing a material layer for the third insulating layer entirely on the substrate SUB and forming an opening for exposing the first insulating layer 510 and the second end of the light-emitting diode ED on the second electrode 220.

Figure 19:
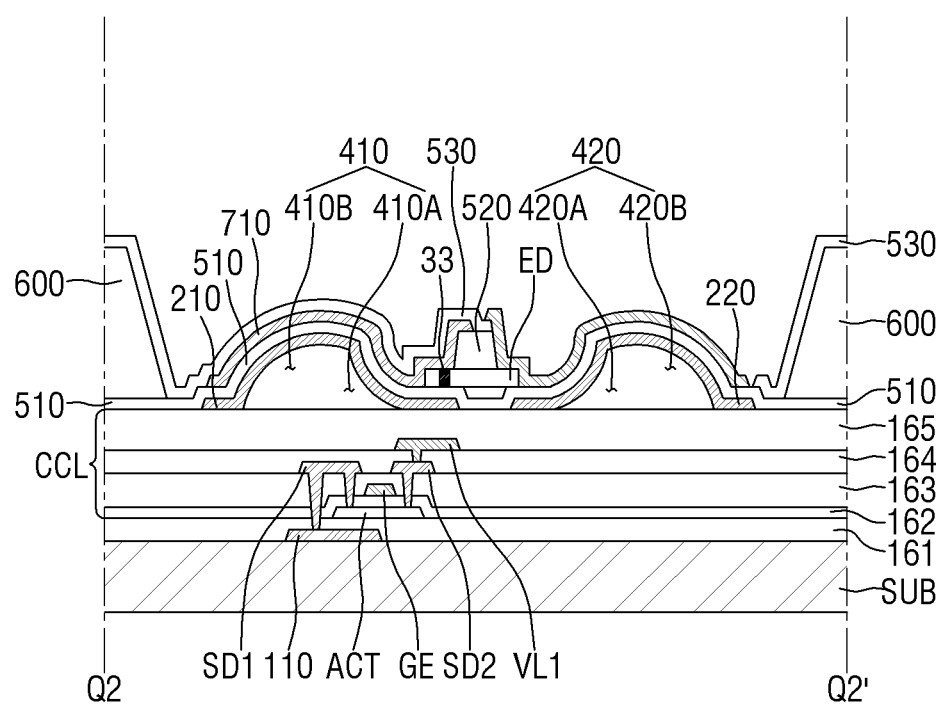

Subsequently, as shown in FIG. 19, a second contact electrode 720 is formed on the third insulating layer 530. In an embodiment, the second contact electrode 720 may be formed via a mask process. For example, a material layer for the second contact electrode is disposed entirely on the substrate SUB. Subsequently, a photoresist layer is applied onto the material layer for the second contact electrode, and a photoresist pattern is formed by exposure and development. Then, etching is carried out by using the photoresist pattern as an etch mask. The material layer for the second contact electrode 720 may be etched entirely by, but is not limited to, wet etching. Subsequently, the photoresist pattern may be removed via a strip process or an ashing process to form the second contact electrode 720 as shown in, for example, FIG. 19.

Subsequently, a fourth insulating layer 540 is formed entirely on the substrate SUB, thereby fabricating the display device 10 as shown in, for example, FIG. 4.

Hereinafter, other embodiments of the present disclosure will be described. In the following description, the same or similar elements will be denoted by the same or similar reference numerals, and redundant descriptions thereof may be omitted or briefly described. Descriptions will focus on differences from the above embodiment.

Figure 20:
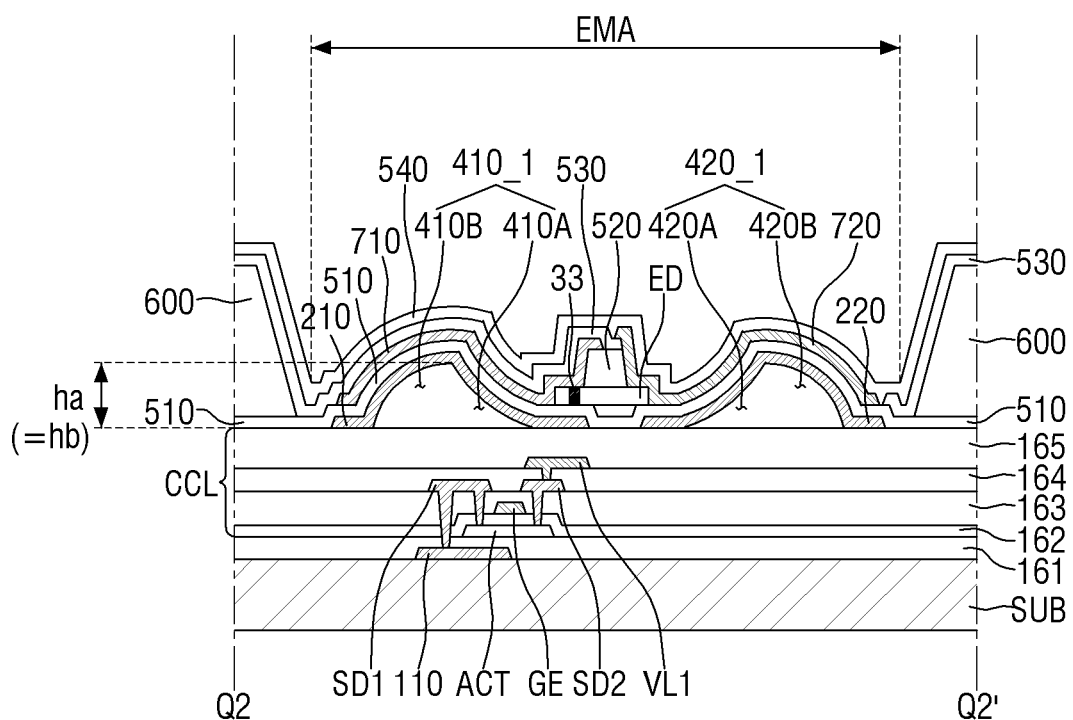
FIG. 20 is a cross-sectional view taken along the line Q2-Q2' of FIG. 3 according to another embodiment.

FIG. 20 is a cross-sectional view taken along the line Q2-Q2' of FIG. 3 of another embodiment.

The embodiment shown in FIG. 20 is different from the embodiment shown in FIG. 7 in that the height hb of the first areas 410A and 420A of the first and second sub-banks 410 and 420 is equal to the maximum height ha of the first and second sub-banks 410 and 420.

According to this embodiment, the height hb of the first areas 410A and 420A of the first and second sub-banks 410 and 420 is equal to the maximum height ha of the first and second sub-banks 410 and 420 in the display device 10, and thus, the amount of the light that is emitted from the light-emitting diode ED and is incident on the first areas 410A and 420A of the first and second sub-banks 410 and 420 may increase. For example, the amount of light that is emitted from the light-emitting diode ED and leaks through regions other than the first areas 410A and 420A of the first and second sub-banks 410 and 420 can be reduced. As a result, the amount of light that is emitted from the light-emitting diode ED and is incident on the first areas 410A and 420A of the first and second sub-banks 410 and 420 is increased so that the efficiency of collecting the light emitted from the light-emitting diode ED can be further improved.

Figure 21:
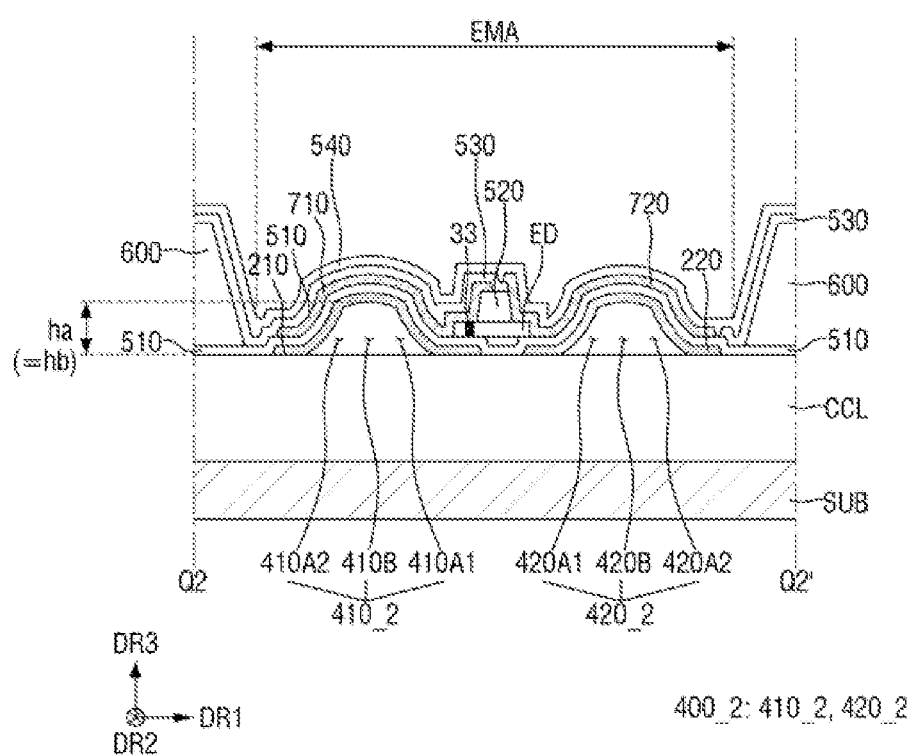
FIG. 21 is a cross-sectional view taken along the line Q2-Q2' of FIG. 3 according to another embodiment.

FIG. 21 is a cross-sectional view taken along the line Q2-Q2' of FIG. 3 according to another embodiment.

The embodiment shown in FIG. 21 is different from the embodiment shown in FIG. 7 in that one of the outer surfaces of a first bank 400_2 that faces a second bank 600 may also include a concave curved shape.

For example, a first sub-bank 410_1 may include a first area 410A1 facing a first end of the light-emitting diode ED and having a concave curved shape, a second area 410A2 facing the second bank 600 and having a concave curved shape, and a third area 410B disposed between the first area 410A1 and the second area 410A2. The third area 410B of the first sub-bank 410_1 may have a convex curved shape or a flat surface.

Similarly, a second sub-bank 420_1 may include a first area 420A1 facing a second end of the light-emitting diode ED and having a concave curved shape, a second area 420A2 facing the second bank 600 and having a concave curved shape, and a third area 420B disposed between the first area 420A1 and the second area 420A2. The third area 420B of the second sub-bank 420_1 may have a convex curved shape or a flat surface.

In concluding the detailed description, those skilled in the art will appreciate that many variations and modifications can be made to the embodiments described herein without substantially departing from the teachings of the present disclosure. Therefore, the described embodiments are used in a generic and descriptive sense only and not for purposes of limitation.

What is claimed is:

1. A display device comprising:
   a substrate;
   a first bank comprising a first sub-bank and a second sub-bank spaced apart from each other on the substrate;
   a first electrode on the first sub-bank;
   a second electrode on the second sub-bank and spaced apart from the first electrode; and
   a light-emitting element between the first sub-bank and the second sub-bank,
   wherein each of the first and second sub-banks has a first area having a concave curved shape in a cross section and being adjacent to the light-emitting element,
   wherein the first electrode has a first section extending beyond the first sub-bank toward the light-emitting element,
   wherein the second electrode has a first section extending beyond the second sub-bank toward the light-emitting element, and
   wherein a width of the first section of the first electrode is different from a width of the first section of the second electrode.

2. The display device of claim 1, wherein an inclination angle of an outer surface of the first area of the first sub-bank and an inclination angle of an outer surface of the first area of the second sub-bank increase along a thickness direction of the substrate.

3. The display device of claim 2, wherein each of the first and second sub-banks also has a second area having an inclination angle of an outer surface decreasing along the thickness direction of the substrate.

4. The display device of claim 1, wherein the first electrode is on the first sub-bank and formed along a surface shape of the first sub-bank, and
wherein the second electrode is on the second sub-bank and formed along a surface shape of the second sub-bank.

5. The display device of claim 1, wherein the first electrode also has a second section on the first area of the first sub-bank,
wherein the second electrode also has a second section on the first area of the second sub-bank, and
wherein each of the second section of the first electrode and the second section of the second electrode has a concave curved shape in a cross section.

6. The display device of claim 5, wherein each of the first electrode and the second electrode comprises silver, aluminum, or an alloy thereof.

7. The display device of claim 5, wherein the second section of the first electrode and the second section of the second electrode face opposite ends of the light-emitting element, respectively.

8. The display device of claim 1, further comprising a via layer on the substrate and having a flat surface,
wherein the first sub-bank and the second sub-bank are directly on the via layer.

9. The display device of claim 8, wherein the first electrode also has a second section on the first area of the first sub-bank and having a concave curved shape in a cross section, and
wherein the first section of the first electrode is on the via layer and is flat.

10. The display device of claim 9, wherein the first section of the first electrode extends from the second section of the first electrode.

11. The display device of claim 1, wherein a height from a surface of the substrate to the first area of the first sub-bank is greater than a height from the surface of the substrate to an upper surface of the light-emitting element.

12. The display device of claim 1, wherein a first end of the light-emitting element overlaps the first section of the first electrode in a thickness direction of the substrate,
wherein a second end of the light-emitting element overlaps the first section of the second electrode in the thickness direction of the substrate, and
wherein a width of the first section of the first electrode is greater than a width of the first section of the second electrode.

13. The display device of claim 12, wherein a width at where the first end of the light-emitting element overlaps the first section of the first electrode in the thickness direction of the substrate is greater than a width at where the second end of the light-emitting element overlaps the first section of the second electrode in the thickness direction of the substrate.

14. The display device of claim 13, wherein the light-emitting element comprises a first semiconductor layer, a second semiconductor layer spaced apart from the first semiconductor layer, and an active layer between the first semiconductor layer and the second semiconductor layer,
wherein the second semiconductor layer is nearer to the first end of the light-emitting element than to the second end of the light-emitting element, and
wherein the first semiconductor layer is near to the second end of the light-emitting element than to the first end of the light-emitting element.

15. The display device of claim 14, wherein the active layer is nearer to the first end of the light-emitting element from a center of the light-emitting element, and
wherein the first section of the first electrode extends entirely under the second semiconductor layer and the active layer of the light-emitting element.

16. A display device comprising:
a substrate;
a via layer on the substrate;
a first sub-bank on the via layer;
a second sub-bank on the via layer and spaced apart from the first sub-bank;
a first electrode on the first sub-bank;
a second electrode on the second sub-bank; and
a light-emitting element between the first sub-bank and the second sub-bank,
wherein each of the first and second sub-banks has a first area facing both ends of the light-emitting element and having a concave curved shape in a cross section,
wherein the first electrode has a first section on the first area of the first sub-bank and a second section extending from the first section of the first electrode toward the light-emitting element,
wherein the second electrode has a first section on the first area of the second sub-bank and a second section extending from the first section of the second electrode toward the light-emitting element,
wherein the second section of the first electrode and the second section of the second electrode are spaced apart from each other on the via layer, and
wherein a width of the second section of the first electrode is different from a width of the second section of the second electrode.

17. The display device of claim 16, wherein the first electrode is on the first sub-bank and on the via layer and is formed along surface shapes of the first sub-bank and the via layer thereunder, and
wherein the second electrode is on the second sub-bank and the via layer and is formed along surface shapes of the second sub-bank and the via layer thereunder.

18. The display device of claim 17, wherein each of the first section of the first electrode and the first section of the second electrode has a concave curved shape in a cross section, and
wherein each of the second section of the first electrode and the second section of the second electrode is flat.

19. The display device of claim 16, wherein the light-emitting element comprises an active layer,
wherein the active layer is nearer to a first end of the light-emitting element from a center of the light-emitting element, and
wherein the first end of the light-emitting element faces the first area of the first sub-bank.

20. The display device of claim 19, wherein the second section of the first electrode overlaps the first end of the light-emitting element in a thickness direction of the substrate,
wherein the second section of the second electrode overlaps a second end of the light-emitting element in the thickness direction of the substrate, and
wherein a width of the second section of the first electrode is greater than a width of the second section of the second electrode.

* * * * *